US012648383B2

(12) United States Patent (10) Patent No.: US 12,648,383 B2

Negoro et al. (45) Date of Patent: Jun. 2, 2026

(54) SUBSTRATE PROCESSING METHOD AND SUBSTRATE PROCESSING DEVICE

(71) Applicant: SCREEN Holdings Co., Ltd., Kyoto (JP)

(72) Inventors: Sei Negoro, Kyoto (JP); Kenji Kobayashi, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 540 days.

(21) Appl. No.: 18/043,323

(22) PCT Filed: Jul. 14, 2021

(86) PCT No.: PCT/JP2021/026379

§ 371 (c)(1),
(2) Date: Feb. 27, 2023

(87) PCT Pub. No.: WO2022/044590

PCT Pub. Date: Mar. 3, 2022

(65) Prior Publication Data

US 2023/0298895 A1 Sep. 21, 2023

(30) Foreign Application Priority Data

Aug. 31, 2020 (JP) ................................. 2020-146097

(51) Int. Cl.
H10P 50/64 (2026.01)
C09K 13/00 (2006.01)
(Continued)

(52) U.S. Cl.
CPC ............ H10P 50/642 (2026.01); C09K 13/00 (2013.01); C09K 13/02 (2013.01); H10P 50/00 (2026.01);
(Continued)

(58) Field of Classification Search
None
See application file for complete search history.

(56) References Cited

U.S. PATENT DOCUMENTS

2010/0126961 A1 5/2010 Kim et al.
2013/0256267 A1 10/2013 Ota et al. ........................ 216/62
(Continued)

FOREIGN PATENT DOCUMENTS

CN 103367111 A 10/2013
JP 2000-349063 A 12/2000
(Continued)

OTHER PUBLICATIONS

Hu et al., "Pre-texturing multi-crystalline silicon wafer via a two-step alkali etching method to achieve efficient nanostructured solar cells", Solar Energy Materials & Solar Cells, vol. 159, pp. 121-127. (Year: 2017).*

(Continued)

*Primary Examiner* — Jiong-Ping Lu

(74) *Attorney, Agent, or Firm* — OSTROLENK FABER LLP

(57) ABSTRACT

In the present invention, an alkaline first etching liquid is fed to a substrate, whereby an etching target representing a silicon monocrystal and/or polysilicon is etched. An alkaline second etching liquid is fed to the substrate after or before the first etching liquid is fed to the substrate, whereby the etching target is etched, the second etching liquid containing a compound that inhibits contact between hydroxide ions and the etching target, the difference between the maximum value and the minimum value of the etching speed with respect to the (110) face, the (100) face, and the (111) face of silicon being smaller in the second etching liquid than in (Continued)

the first etching liquid, and the maximum value of the etching speed being smaller in the second etching liquid than in the first etching liquid.

5 Claims, 10 Drawing Sheets

(51) Int. Cl.

| | | |
|---|---|---|
| *C09K 13/02* | (2006.01) |
| *H10P 50/00* | (2026.01) |
| *H10P 50/20* | (2026.01) |
| *H10P 50/28* | (2026.01) |
| *H10P 50/66* | (2026.01) |
| *H10P 52/00* | (2026.01) |
| *H10P 95/70* | (2026.01) |

(52) U.S. Cl.
CPC ............ *H10P 50/20* (2026.01); *H10P 50/283* (2026.01); *H10P 50/644* (2026.01); *H10P 50/667* (2026.01); *H10P 52/00* (2026.01); *H10P 95/70* (2026.01)

(56)     References Cited

U.S. PATENT DOCUMENTS

| | | | |
|---|---|---|---|
| 2014/0080312 A1 | 3/2014 | Iwamoto et al. ............. 438/748 |
| 2017/0309468 A1 | 10/2017 | Shirai et al. |
| 2019/0091640 A1 | 3/2019 | Nishide et al. |
| 2020/0248076 A1 | 8/2020 | Seike et al. |
| 2021/0057235 A1 | 2/2021 | Negoro et al. |
| 2021/0269716 A1 | 9/2021 | Seike et al. |
| 2021/0313191 A1 | 10/2021 | Negoro et al. |

FOREIGN PATENT DOCUMENTS

| | | | |
|---|---|---|---|
| JP | 2006-093453 A | 4/2006 |
| JP | 2009-177007 A | 8/2009 |
| JP | 2011-129940 A | 6/2011 |
| JP | 2013-251459 A | 12/2013 |
| JP | 2019-153721 A | 9/2019 |
| JP | 2020-038956 A | 3/2020 |
| JP | 2020-126997 A | 8/2020 |
| JP | 2021-136429 A | 9/2021 |
| TW | 201918587 A | 5/2019 |

OTHER PUBLICATIONS

International Preliminary Report on Patentability (Chapter I) mailed Mar. 9, 2023 with a copy of Notification from the International Bureau (Form PCT/IB/326) in corresponding PCT International Application No. PCT/JP2021/026379 in Japanese.

English translation of the International Preliminary Report on Patentability (Chapter I) mailed Mar. 9, 2023 with a copy of Notification from the International Bureau (Form PCT/IB/338) in corresponding PCT International Application No. PCT/JP2021/026379.

International Search Report mailed Aug. 31, 2021 in corresponding PCT International Application No. PCT/JP2021/026379.

\* cited by examiner

Start

S1    Carry-in substrate

S2    Start rotating substrate

S3    Supply DHF

S4    Supply rinse liquid

S5    Supply first etching liquid

S6    Supply second etching liquid

S7    Repeat supplying first and second etching liquids N times (N=0、1、2、3・・・)

S8    Supply rinse liquid

S9    Dry

S10   Stop rotating substrate

S11   Carry-out substrate

End

Processing time

SUBSTRATE PROCESSING METHOD AND SUBSTRATE PROCESSING DEVICE

CROSS-REFERENCE TO RELATED APPLICATIONS

The present application is a 35 U.S.C. §§ 371 national stage application of International Application No. PCT/JP2021/026379 filed Jul. 14, 2021, which claims priority to Japanese Patent Application No. 2020-146097, filed Aug. 31, 2020, the contents of which are incorporated herein by reference.

TECHNICAL FIELD

The present invention relates to a substrate processing method and a substrate processing apparatus that process a substrate. Examples of substrates include a semiconductor wafer, a substrate for a flat panel display (FPD) such as a liquid crystal display and an organic electroluminescence (organic EL) display, a substrate for an optical disc, a substrate for a magnetic disc, a substrate for a magneto-optical disc, a substrate for a photomask, a ceramic substrate, a substrate for a solar cell, and the like.

In a manufacturing process of semiconductor devices, FPDs, etc., alkaline etching liquid such as TMAH (tetramethyl ammonium hydroxide) or KOH (potassium hydroxide) may be supplied to a substrate such as a semiconductor wafer or a glass substrate for a FPD. When a silicon single crystal is etched using the alkaline etching, the etching speed differs for each crystal plane of silicon. Patent Literature 1 discloses supplying TMAH containing propylene glycol to a substrate in order to mitigate the dependence of the etching speed on the plane direction.

CITATION LIST

Patent Literature

Patent Literature 1: JP 2020-38956 A

SUMMARY OF INVENTION

Technical Problem

As disclosed in Patent Literature 1, when TMAH containing propylene glycol is supplied to the substrate, although anisotropy of etching is lowered, the etching speed (the etching amount per unit time) is also lowered. Thus, processing time increase. If acid etching liquid such as mixed liquid of hydrofluoric acid and nitric acid is used, the etching target is uniformly etched in a short time, but the alkaline etching liquid may be preferred depending on the condition of the substrate. For example, in selective etching to etch an etching target such as silicon single crystal or polysilicon while inhibiting etching of a non-etching target such as silicon oxide or silicon nitride, high selectivity cannot be obtained unless alkaline etching liquid is used.

Thus, an object of the present invention is to provide a substrate processing method and a substrate processing apparatus that are able to uniformly etch an etching target representing at least one of silicon single crystal and polysilicon while shortening processing time.

Solution to Problem

A preferred embodiment of the present invention provides a substrate processing method to process a substrate including an etching target that represents at least one of silicon single crystal and polysilicon, the substrate processing method including a first etching step of etching the etching target by supplying the substrate with alkaline first etching liquid and a second etching step of etching the etching target by supplying the substrate with alkaline second etching liquid before or after the first etching liquid is supplied to the substrate, the second etching liquid containing a chemical compound that inhibits contact of a hydroxide ion and the etching target, the second etching liquid having a smaller difference between a maximum value and a minimum value of etching speeds for a (110) plane, a (100) plane, and a (111) plane of silicon than that of the first etching liquid, the second etching liquid having the maximum value of the etching speeds smaller than that of the first etching liquid.

In this method, the alkaline first etching liquid is supplied to the substrate in which the etching target representing at least one of silicon single crystal and polysilicon is exposed. Thus, the etching target is etched. Before or after the first etching liquid is supplied to the substrate, the alkaline second etching liquid is supplied to the substrate. Thus, the etching target is further etched.

The second etching liquid is liquid containing the chemical compound that inhibits contact of the hydroxide ion and the etching target. This chemical compound changes anisotropy of etching and the etching speeds. Specifically, the second etching liquid has the smaller difference between the maximum value and the minimum value of etching speeds for the (110) plane, the (100) plane, and the (111) plane of silicon than that of the first etching liquid. That is, the second etching liquid has a lower anisotropy of etching than the first etching liquid. Further, the second etching liquid has the maximum value of the etching speeds for these crystal planes smaller than that of the first etching liquid.

When the first etching liquid is supplied to the substrate, although the etching uniformity is inferior to that of the second etching liquid, the etching target is etched at a relatively high speed. When the second etching liquid is supplied to the substrate, although the etching is slower compared to the first etching liquid, the etching target is uniformly etched. Thus, it is possible to uniformly etch the etching target while shortening the processing time compared to the case where the second etching liquid is continuously supplied by supplying the substrate with the first etching liquid and the second etching liquid that differ from each other in anisotropy of etching and the etching speed.

In the preferred embodiment, at least one of the following features may be added to the substrate processing method.

The second etching step includes a step of replacing the first etching liquid that is in contact with the substrate with the second etching liquid by supplying the second etching liquid to the substrate.

In this method, after the first etching liquid has been supplied to the substrate, the second etching liquid is supplied to the substrate rather than supplying liquid other than the second etching liquid to the substrate. Thus, the first etching liquid that is in contact with the substrate is replaced with the second etching liquid. When the etching target is oxidized, the surface layer of the etching target changes to silicon oxide. Silicon oxide is not etched or hardly etched by alkaline etching liquid.

If the second etching liquid is supplied to the substrate immediately after the first etching liquid is supplied to the substrate, it is possible to shorten the time from the supply of the first etching liquid to the supply of the second etching liquid and to inhibit or prevent oxidation of the etching target. Thus, it is possible to bring the actual shape of the etching target that has been etched closer to the intended shape while shortening the processing time compared to the case where the second etching liquid is continuously supplied.

The first etching liquid is alkaline etching liquid containing the chemical compound, and the first etching liquid and the second etching liquid differ from each other in at least one of composition, concentration, and temperature.

In this method, the chemical compound is contained not only in the second etching liquid but also in the first etching liquid. Thus, the first etching liquid is also lowered in anisotropy of etching. The first etching liquid and the second etching liquid differ from each other in at least one of composition, concentration, and temperature. If at least one of these is different, anisotropy of etching and the etching speed will change. Thus, it is possible to uniformly etch the etching target while shortening the processing time compared to the case where the second etching liquid is continuously supplied.

In a case where the alkaline etching liquid containing the chemical compound is solution containing an etching substance, the chemical compound and solvent, the first etching liquid and the second etching liquid may be different in a type of at least one of the etching substance and the chemical compound, or a substance other than the etching substance, the chemical compound and the solvent may be contained in at least one of the first etching liquid and the second etching liquid. The first etching liquid and the second etching liquid may be different in concentration of the etching substance or the chemical compound, or may be different in concentration of both of the etching substance and the chemical compound.

The second etching step includes at least one of a step of mixing the chemical compound with the first etching liquid that is in contact with the substrate and a step of mixing the first etching liquid with a chemical-compound-containing liquid in a state in which the chemical-compound-containing liquid that contains the chemical compound is in contact with the substrate.

In this method, after the first etching liquid is supplied to the substrate, the chemical compound is supplied to the substrate. Thus, the chemical compound is mixed with the first etching liquid that is in contact with the substrate and the first etching liquid containing the chemical compound is supplied to the substrate as the second etching liquid. Alternatively, after the chemical-compound-containing liquid that contains the chemical compound is supplied to the substrate, the first etching liquid is supplied to the substrate. Thus, the first etching liquid is mixed with the chemical-compound-containing liquid that is in contact with the substrate and the mixed liquid of the chemical-compound-containing liquid and the first etching liquid is supplied to the substrate as the second etching liquid. If the supply of the first etching liquid is continued, the chemical-compound-containing liquid disappears from the vicinity of the substrate, and only the first etching liquid is supplied to the substrate. In this way, since the second etching liquid is prepared using the first etching liquid, it is possible to reduce the amount of the etching liquid used.

A repetition step of performing one cycle including the first etching step and the second etching step a plurality of times is included.

In this method, the first etching liquid and the second etching liquid are alternately supplied to the substrate a plurality of times. When the first etching liquid having high anisotropy is continuously supplied to the substrate, an area in which the (111) plane having low etching speed is exposed increases. In this case, since a contact area between the crystal planes other than the (111) plane and the first etching liquid is reduced, the etching speed is lowered. If the second etching liquid having low anisotropy is supplied, the (111) plane is etched and an area in which this crystal plane is exposed decreases. After that, if the first etching liquid is supplied to the substrate, it is possible to etch the substrate at a high etching speed again.

Another preferred embodiment of the present invention provides a substrate processing apparatus to process a substrate including an etching target that represents at least one of silicon single crystal and polysilicon, the substrate processing apparatus including a substrate holding unit that holds the substrate a first etching unit that etches the etching target by supplying the substrate held by the substrate holding unit with alkaline first etching liquid and a second etching unit that etches the etching target by supplying the substrate held by the substrate holding unit with alkaline second etching liquid before or after the first etching liquid is supplied to the substrate, the second etching liquid containing a chemical compound that inhibits contact of a hydroxide ion and the etching target, the second etching liquid having a smaller difference between a maximum value and a minimum value of etching speeds for a (110) plane, a (100) plane, and a (111) plane of silicon than that of the first etching liquid, the second etching liquid having the maximum value of the etching speeds smaller than that of the first etching liquid. According to this arrangement, the same effects as those of the substrate processing method described above can be obtained.

The above and other objects, features, and advantages of the present invention will become more apparent from the following detailed description of the preferred embodiments with reference to the attached drawings.

DETAILED DESCRIPTION OF PREFERRED EMBODIMENTS

Figure 1A:
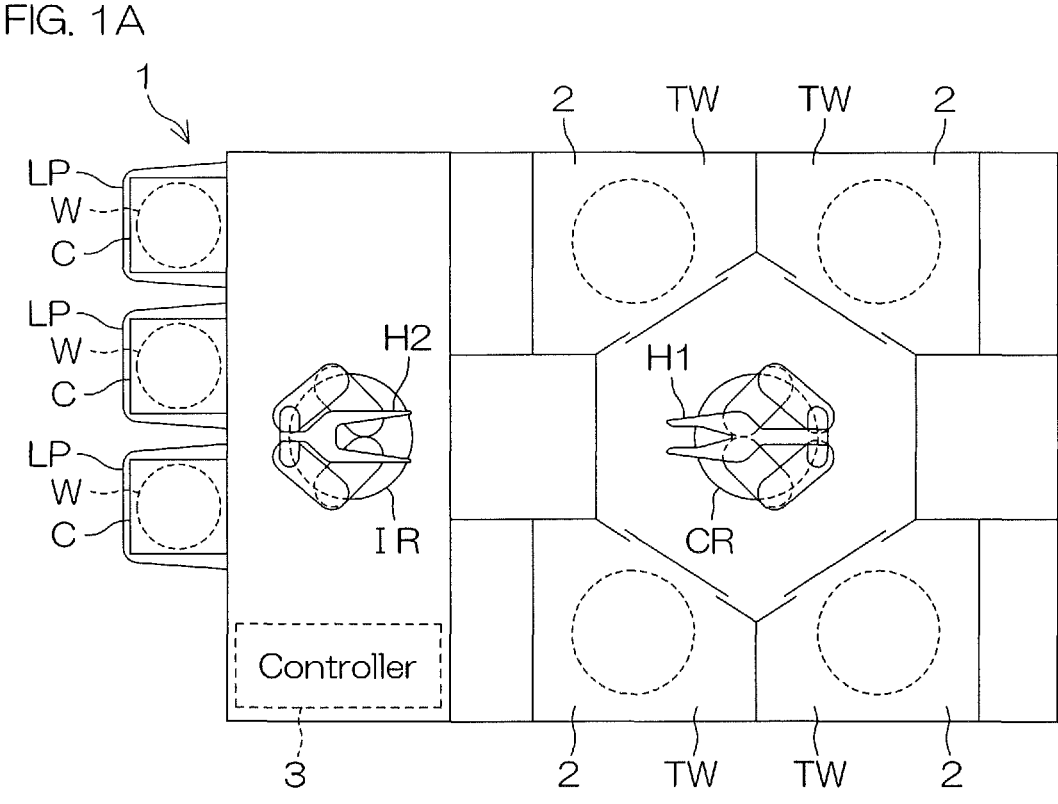
FIG. 1A is a schematic view of a substrate processing apparatus according to a first preferred embodiment of the present invention when viewed from above.
Figure 1B:
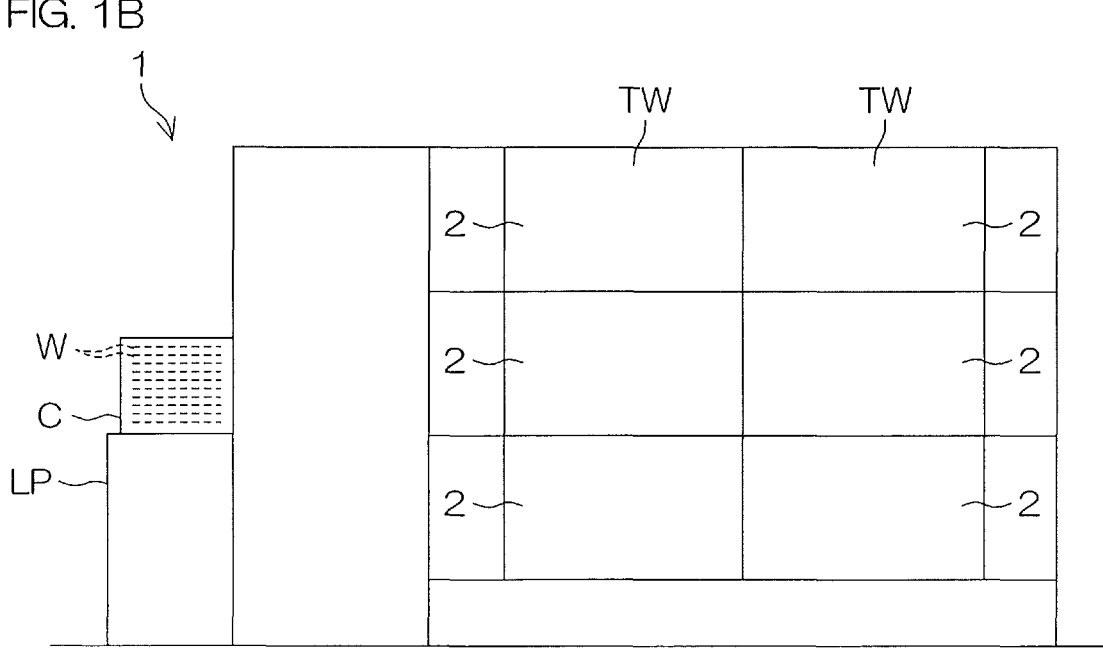
FIG. 1B is a schematic view of the substrate processing apparatus when viewed from the side.

FIG. 1A is a schematic view of a substrate processing apparatus 1 according to a first preferred embodiment of the present invention when viewed from above. FIG. 1B is a schematic view of the substrate processing apparatus 1 when viewed from a side.

The substrate processing apparatus 1 is a single substrate processing-type apparatus which processes disc-shaped substrates W such as semiconductor wafers one by one. The substrate processing apparatus 1 includes a load port LP which holds a carrier C that houses the substrates W, a plurality of processing units 2 which process the substrates W transferred from the carrier C on the load port LP, a transfer robot which transfers the substrates W between the carrier C on the load port LP and the processing unit 2 and a controller 3 which controls the substrate processing apparatus 1.

The transfer robot includes an indexer robot IR which carries the substrate W into and out from the carrier C on the load port LP and a center robot CR which carries the substrate W into and out from the processing units 2. The indexer robot IR transfers the substrate W between the load port LP and the center robot CR, the center robot CR transfers the substrate W between the indexer robot IR and the processing unit 2. The center robot CR includes a hand H1 which supports the substrate W and the indexer robot IR includes a hand H2 which supports the substrate W.

The plurality of processing units 2 form a plurality of towers TW disposed around the center robot CR in a plan view. FIG. 1A shows an example in which four towers TW are formed. The center robot CR is able to access any one of the towers TW. As shown in FIG. 1B, each tower TW includes a plurality of processing units 2 (for example, three processing units 2) stacked vertically.

Figure 2:
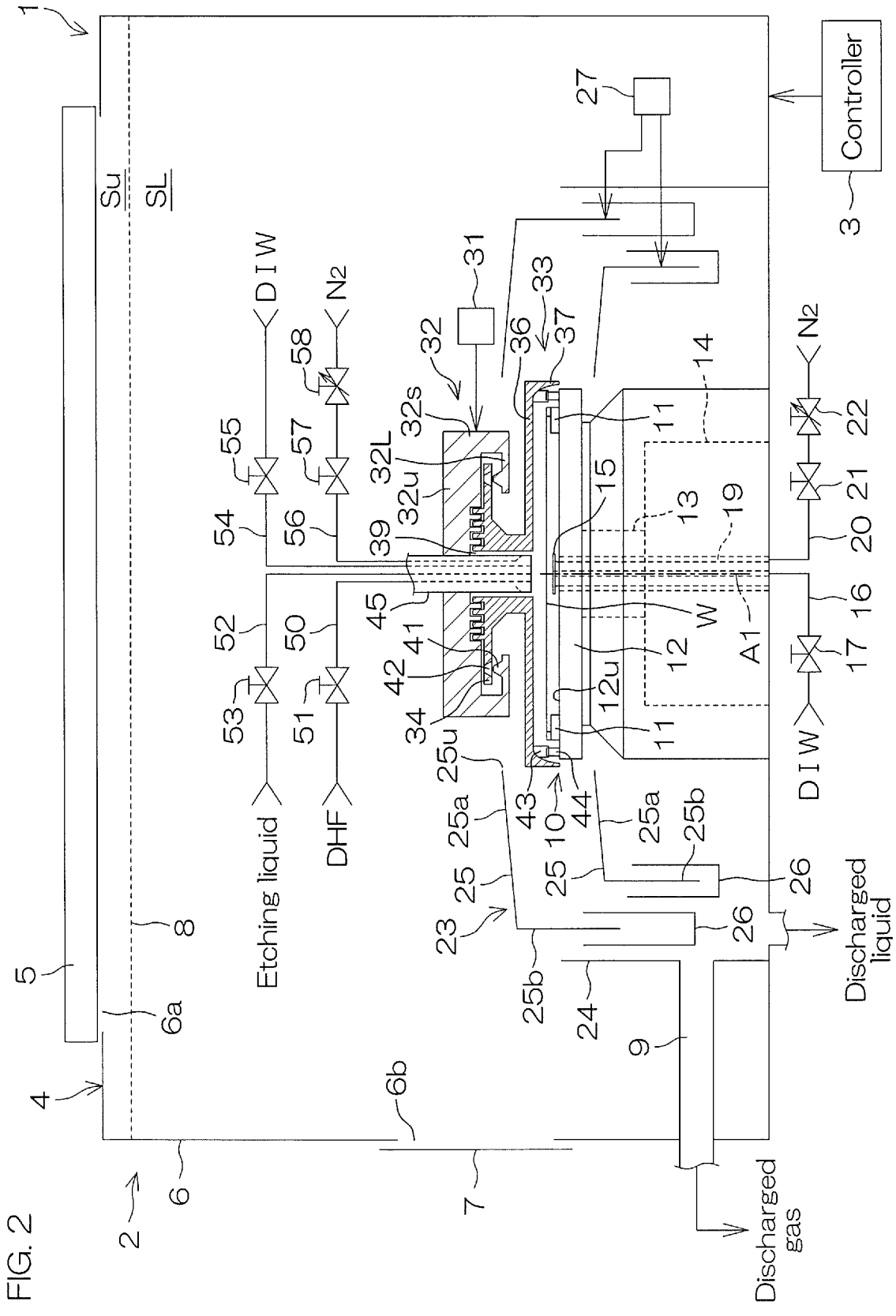
FIG. 2 is a schematic view of an interior of a processing unit included in the substrate processing apparatus when viewed horizontally.
Figure 3:
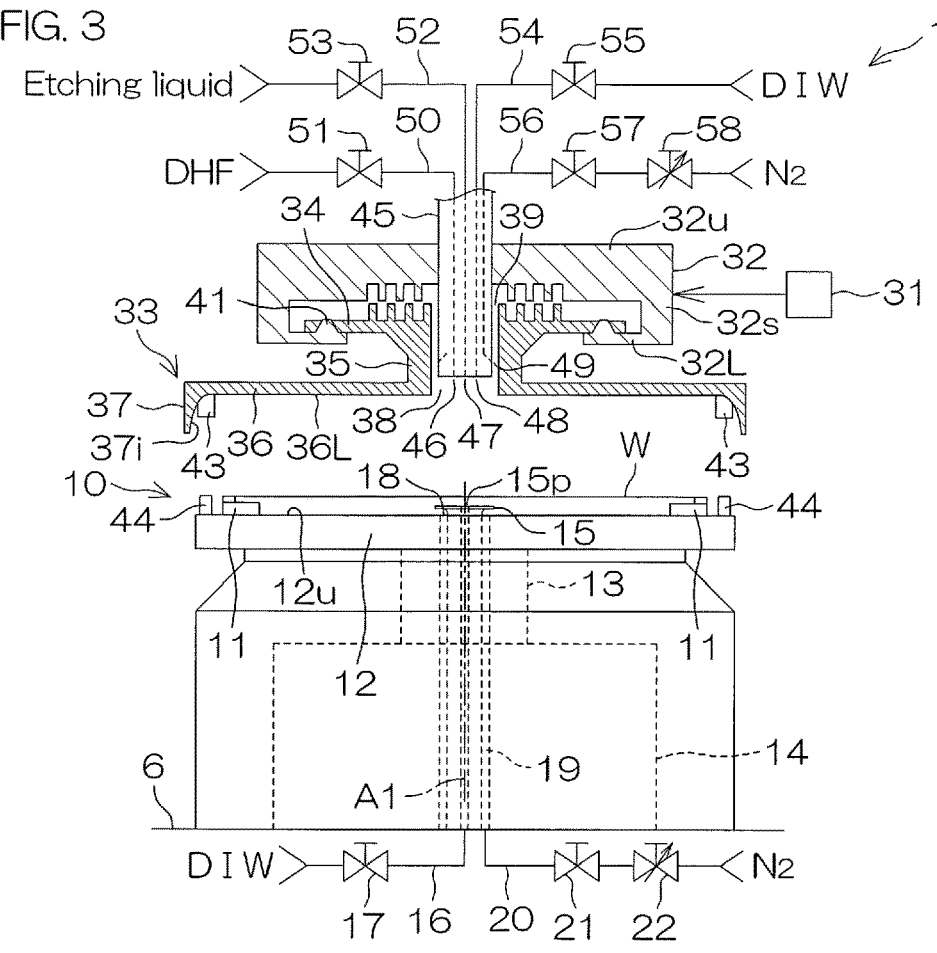
FIG. 3 is an enlarged view of a portion of FIG. 2.

FIG. 2 is a schematic view of the interior of a processing unit 2 included in the substrate processing apparatus 1 when viewed horizontally. FIG. 3 is an enlarged view of a portion of FIG. 2. FIG. 2 shows a state where a raising/lowering frame 32 and a shielding member 33 are located at lower positions and FIG. 3 shows a state where the raising/lowering frame 32 and the shielding member 33 are located at upper positions. In the following description, unless otherwise specified, TMAH represents aqueous solution of TMAH.

The processing unit 2 includes a box-shaped chamber 4 which has an internal space, a spin chuck 10 which rotates one substrate W around a vertical rotation axis A1 passing through the central portion of the substrate W while holding the substrate W horizontally within the chamber 4 and a tubular processing cup 23 which surrounds the spin chuck 10 around the rotation axis A1.

The chamber 4 includes a box-shaped partition wall 6 provided with a carry-in/carry-out port 6b through which the substrate W passes, and a shutter 7 which opens and closes the carry-in/carry-out port 6b. The chamber 4 further includes a rectifying plate 8 which is arranged below an air outlet 6a that is open in the ceiling surface of the partition wall 6. An FFU 5 (fan filter unit) which feeds clean air (air filtered by a filter) is arranged above the air outlet 6a. An exhaust duct 9 which discharges a gas within the chamber 4 is connected to the processing cup 23. The air outlet 6a is provided in an upper end portion of the chamber 4, and the exhaust duct 9 is arranged in a lower end portion of the chamber 4. A portion of the exhaust duct 9 is arranged outside the chamber 4.

The rectifying plate 8 partitions the internal space of the partition wall 6 into an upper space Su above the rectifying plate 8 and a lower space SL below the rectifying plate 8. The upper space Su between the ceiling surface of the partition wall 6 and the upper surface of the rectifying plate 8 is a diffusion space in which the clean air diffuses. The lower space SL between the lower surface of the rectifying plate 8 and the floor surface of the partition wall 6 is a processing space in which the substrate W is processed. The spin chuck 10 and the processing cup 23 are arranged in the lower space SL. A distance in a vertical direction from the floor surface of the partition wall 6 to the lower surface of the rectifying plate 8 is longer than a distance in the vertical direction from the upper surface of the rectifying plate 8 to the ceiling surface of the partition wall 6.

The FFU 5 feeds the clean air via the air outlet 6a to the upper space Su. The clean air supplied to the upper space Su hits the rectifying plate 8 and diffuses in the upper space Su. The clean air within the upper space Su passes through a plurality of through holes which vertically penetrate the rectifying plate 8 and flows downward from the entire region of the rectifying plate 8. The clean air supplied to the lower space SL is sucked into the processing cup 23 and is discharged through the exhaust duct 9 from the lower end portion of the chamber 4. Thus, a uniform downward flow (down flow) of the clean air which flows downward from the rectifying plate 8 is formed in the lower space SL. The processing of the substrate W is performed in a state where the downward flow of the clean air is formed.

The spin chuck 10 includes a disc-shaped spin base 12 which is held by a horizontal posture, a plurality of chuck pins 11 which hold the substrate W in the horizontal posture above the spin base 12, a spin shaft 13 which extends downward from the central portion of the spin base 12 and a spin motor 14 which rotates the spin shaft 13 so as to rotate the spin base 12 and the chuck pins 11. The spin chuck 10 is not limited to a clamping type chuck which brings the chuck pins 11 into contact with the outer circumferential surface of the substrate W, and the spin chuck 10 may be a vacuum-type chuck which sucks the rear surface (lower surface) of the substrate W that is a non-device formation surface to the upper surface 12u of the spin base 12 so as to hold the substrate W horizontally.

The spin base 12 includes the upper surface 12*u* which is arranged below the substrate W. The upper surface 12*u* of the spin base 12 is parallel to the lower surface of the substrate W. The upper surface 12*u* of the spin base 12 is an opposed surface which faces the lower surface of the substrate W. The upper surface 12*u* of the spin base 12 has a circular ring-shaped configuration which surrounds the rotation axis A1. The outside diameter of the upper surface 12*u* of the spin base 12 is larger than that of the substrate W. The chuck pins 11 protrude upward from the outer circumferential portion of the upper surface 12*u* of the spin base 12. The chuck pins 11 are held on the spin base 12. The substrate W is held on the chuck pins 11 in a state where the lower surface of the substrate W is separated from the upper surface 12*u* of the spin base 12.

The processing unit 2 includes a lower surface nozzle 15 which discharges the processing liquid toward the central portion of the lower surface of the substrate W. The lower surface nozzle 15 includes a nozzle disc portion which is arranged between the upper surface 12*u* of the spin base 12 and the lower surface of the substrate W and a nozzle tubular portion which extends downward from the nozzle disc portion. The liquid discharge port 15*p* of the lower surface nozzle 15 is open in the central portion of the upper surface of the nozzle disc portion. In a state where the substrate W is held on the spin chuck 10, the liquid discharge port 15*p* of the lower surface nozzle 15 faces the central portion of the lower surface of the substrate W.

The substrate processing apparatus 1 includes lower rinse liquid piping 16 which guide a rinse liquid to the lower surface nozzle 15 and a lower rinse liquid valve 17 which is interposed in the lower rinse liquid piping 16. When the lower rinse liquid valve 17 is opened, the rinse liquid guided by the lower rinse liquid piping 16 is discharged upward from the lower surface nozzle 15 and supplied to the central portion of the lower surface of the substrate W. The rinse liquid supplied to the lower surface nozzle 15 is pure water (DIW: deionized water). The rinse liquid supplied to the lower surface nozzle 15 is not limited to pure water, and may be any one of IPA (isopropyl alcohol), carbonated water, electrolytic ion water, hydrogen water, ozone water and a hydrochloric acid water of a dilute concentration (for example, about 1 to 100 ppm).

Although not shown, the lower rinse liquid valve 17 includes a valve body provided with an internal flow path where the liquid flows and an annular valve seat surrounding the internal flow path, a valve member which is movable with respect to the valve seat and an actuator which moves the valve member between a closed position where the valve member contacts the valve seat and an opened position where the valve member is separated from the valve seat. The same applies to other valves. The actuator may be a pneumatic actuator or an electric actuator or an actuator other than those. The controller 3 controls the actuator to open and close the lower rinse liquid valve 17.

The outer circumferential surface of the lower surface nozzle 15 and the inner circumferential surface of the spin base 12 defines a lower tubular path 19 which extends vertically. The lower tubular path 19 includes a lower central opening 18 which is open in the central portion of the upper surface 12*u* of the spin base 12. The lower central opening 18 is arranged below the nozzle disc portion of the lower surface nozzle 15. The substrate processing apparatus 1 includes lower gas piping 20 which guide an inert gas supplied via the lower tubular path 19 to the lower central opening 18, a lower gas valve 21 which is interposed in the lower gas piping 20 and a lower gas flow rate adjusting valve

22 which changes the flow rate of the inert gas supplied from the lower gas piping 20 to the lower tubular path 19.

The inert gas supplied from the lower gas piping 20 to the lower tubular path 19 is nitrogen gas. The inert gas is not limited to nitrogen gas, and may be another inert gas such as helium gas or argon gas. These inert gases are low oxygen gases which have an oxygen concentration lower than an oxygen concentration in air (about 21% of the volume)

When the lower gas valve 21 is opened, the nitrogen gas supplied from the lower gas piping 20 to the lower tubular path 19 is discharged upward from the lower central opening 18 at a flow rate corresponding to the degree of opening of the lower gas flow rate adjusting valve 22. Thereafter, the nitrogen gas flows radially in all directions in a space between the lower surface of the substrate W and the upper surface 12*u* of the spin base 12. Thus, the space between the substrate W and the spin base 12 is filled with the nitrogen gas, and thus an oxygen concentration in an atmosphere is reduced. The oxygen concentration in the space between the substrate W and the spin base 12 is changed according to the degree of opening of the lower gas valve 21 and the lower gas flow rate adjusting valve 22. The lower gas valve 21 and the lower gas flow rate adjusting valve 22 are included in an atmosphere oxygen concentration changing unit that changes oxygen concentration in an atmosphere that is in contact with the substrate W.

The processing cup 23 includes a plurality of guards 25 which receive the liquid discharged outward from the substrate W, a plurality of cups 26 which receive the liquid guided downward by the guards 25 and a cylindrical outer wall member 24 which surrounds the guards 25 and the cups 26. FIG. 2 shows an example where two guards 25 and two cups 26 are provided.

The guard 25 includes a cylindrical guard tubular portion 25*b* which surrounds the spin chuck 10 and an annular guard ceiling portion 25*a* which extends obliquely upward from the upper end portion of the guard tubular portion 25*b* toward the rotation axis A1. Guard ceiling portions 25*a* vertically overlap each other, and guard tubular portions 25*b* are arranged concentrically. The cups 26 are arranged below the guard tubular portions 25*b*, respectively. The cup 26 defines an annular liquid receiving groove which is open upward.

The processing unit 2 includes a guard raising/lowering unit 27 which individually raises and lowers the guards 25. The guard raising/lowering unit 27 locates the guard 25 in an arbitrary position from an upper position to a lower position. The upper position is the position in which the upper end 25*u* of the guard 25 is arranged higher than a holding position in which the substrate W held by the spin chuck 10 is arranged. The lower position is the position in which the upper end 25*u* of the guard 25 is arranged lower than the holding position. The annular upper end of the guard ceiling portion 25*a* corresponds to the upper end 25*u* of the guard 25. The upper end 25*u* of the guard 25 surrounds the substrate W and the spin base 12 in plan view.

When the processing liquid is supplied to the substrate W in a state where the spin chuck 10 rotates the substrate W, the processing liquid supplied to the substrate W is spun off from the substrate W. When the processing liquid is supplied to the substrate W, at least one of the upper ends 25*u* of the guards 25 is arranged higher than the substrate W. Thus, the processing liquid such as the chemical liquid or the rinse liquid which is discharged from the substrate W is received by any one of the guards 25 and guided to the cup 26 corresponding to this guard 25.

As shown in FIG. 3, the processing unit 2 includes the raising/lowering frame 32 which is arranged above the spin chuck 10, the shielding member 33 which is suspended from the raising/lowering frame 32, a center nozzle 45 which is inserted into the shielding member 33 and a shielding member raising/lowering unit 31 which raises and lowers the raising/lowering frame 32 so as to raise and lower the shielding member 33 and the center nozzle 45. The raising/lowering frame 32, the shielding member 33 and the center nozzle 45 are arranged below the rectifying plate 8.

The shielding member 33 includes a disc portion 36 which is arranged above the spin chuck 10 and a tubular portion 37 which extends downward from the outer circumferential portion of the disc portion 36. The shielding member 33 includes an inner surface which has a cup-shaped configuration that is concave upward. The inner surface of the shielding member 33 includes a lower surface 36L of the disc portion 36 and the inner circumferential surface 37i of the tubular portion 37. In the following description, the lower surface 36L of the disc portion 36 may also be referred to as the lower surface 36L of the shielding member 33.

The lower surface 36L of the disc portion 36 is an opposed surface which faces the upper surface of the substrate W. The lower surface 36L of the disc portion 36 is parallel to the upper surface of the substrate W. The inner circumferential surface 37i of the tubular portion 37 extends downward from the outer circumferential edge of the lower surface 36L of the lower surface 36L. The inside diameter of the tubular portion 37 is increased as the lower end of the inner circumferential surface 37i is approached. The inside diameter of the lower end of the inner circumferential surface 37i of the tubular portion 37 is larger than the diameter of the substrate W. The inside diameter of the lower end of the inner circumferential surface 37i of the tubular portion 37 may be larger than the outside diameter of the spin base 12. When the shielding member 33 is arranged in the lower position (position shown in FIG. 2) which will be described below, the substrate W is surrounded by the inner circumferential surface 37i of the tubular portion 37.

The lower surface 36L of the disc portion 36 has a circular ring-shaped configuration which surrounds the rotation axis A1. The inner circumferential edge of the lower surface 36L of the disc portion 36 defines an upper central opening 38 which is open in the central portion of the lower surface 36L of the disc portion 36. The inner circumferential surface of the shielding member 33 defines a through hole which extends upward from the upper central opening 38. The through hole of the shielding member 33 vertically penetrates the shielding member 33. The center nozzle 45 is inserted into the through hole of the shielding member 33. The outside diameter of the lower end of the center nozzle 45 is smaller than the diameter of the upper central opening 38.

The inner circumferential surface of the shielding member 33 is coaxial with the outer circumferential surface of the center nozzle 45. The inner circumferential surface of the shielding member 33 surrounds the outer circumferential surface of the center nozzle 45 across an interval in a radial direction (direction orthogonal to the rotation axis A1). The inner circumferential surface of the shielding member 33 and the outer circumferential surface of the center nozzle 45 define an upper tubular path 39 which extends vertically. The center nozzle 45 protrudes upward from the raising/lowering frame 32 and the shielding member 33. When the shielding member 33 is suspended from the raising/lowering frame 32, the lower end of the center nozzle 45 is arranged higher than the lower surface 36L of the disc portion 36. The processing liquid such as the chemical liquid or the rinse liquid is discharged downward from the lower end of the center nozzle 45.

The shielding member 33 includes a tubular connection portion 35 which extends upward from the disc portion 36, and an annular flange portion 34 which extends outward from the upper end portion of the connection portion 35. The flange portion 34 is arranged higher than the disc portion 36 and the tubular portion 37 of the shielding member 33. The flange portion 34 is parallel to the disc portion 36. The outside diameter of the flange portion 34 is smaller than that of the tubular portion 37. The flange portion 34 is supported on the lower plate 32L of the raising/lowering frame 32 which will be described below.

The raising/lowering frame 32 includes an upper plate 32u which is positioned higher than the flange portion 34 of the shielding member 33, a side ring 32s which extends downward from the upper plate 32u and surrounds the flange portion 34, and an annular lower plate 32L which extends inward from the lower end portion of the side ring 32s and is located below the flange portion 34 of the shielding member 33. The outer circumferential portion of the flange portion 34 is arranged between the upper plate 32u and the lower plate 32L. The outer circumferential portion of the flange portion 34 is movable vertically in a space between the upper plate 32u and the lower plate 32L.

The raising/lowering frame 32 and the shielding member 33 include locating protrusions 41 and locating holes 42 which restrict the relative movement of the raising/lowering frame 32 and the shielding member 33 in a circumferential direction (a direction around the rotation axis A1) in a state where the shielding member 33 is supported by the raising/lowering frame 32. FIG. 2 shows an example where a plurality of locating protrusions 41 are provided on the lower plate 32L and where a plurality of locating holes 42 are provided in the flange portion 34. The locating protrusions 41 may be provided on the flange portion 34, and the locating holes 42 may be provided in the lower plate 32L.

The locating protrusions 41 are arranged on a circle which has a center arranged on the rotation axis A1. Similarly, the locating holes 42 are arranged on a circle which has a center arranged on the rotation axis A1. The locating holes 42 are arranged in the circumferential direction with the same regularity as the locating protrusions 41. The locating protrusions 41 which protrude upward from the upper surface of the lower plate 32L are inserted into the locating holes 42 which extend upward from the lower surface of the flange portion 34. Thus, the movement of the shielding member 33 in the circumferential direction with respect to the raising/lowering frame 32 is restricted.

The shielding member 33 includes a plurality of upper support portions 43 which protrude downward from the inner surface of the shielding member 33. The spin chuck 10 includes a plurality of lower support portions 44 which supports the upper support portions 43, respectively. The upper support portions 43 are surrounded by the tubular portion 37 of the shielding member 33. The lower ends of the upper support portions 43 are arranged higher than the lower end of the tubular portion 37. The distance in the radial direction from the rotation axis A1 to the upper support portion 43 is larger than the radius of the substrate W. Similarly, the distance in the radial direction from the rotation axis A1 to the lower support portion 44 is larger than the radius of the substrate W. The lower support portions 44 protrude upward from the upper surface 12u of the spin base 12. The lower support portions 44 are arranged on the outer side with respect to the chuck pins 11.

The upper support portions 43 are arranged on a circle which has a center arranged on the rotation axis A1. Similarly, the lower support portions 44 are arranged on a circle which has a center arranged on the rotation axis A1. The lower support portions 44 are arranged in the circumferential direction with the same regularity as the upper support portions 43. The lower support portions 44 are rotated together with the spin base 12 around the rotation axis A1. The rotational angle of the spin base 12 is changed by the spin motor 14. When the spin base 12 is arranged at a reference rotational angle, the upper support portions 43 respectively overlap the lower support portions 44 in plan view.

The shielding member raising/lowering unit 31 is coupled to the raising/lowering frame 32. When the shielding member raising/lowering unit 31 lowers the raising/lowering frame 32 in a state where the flange portion 34 of the shielding member 33 is supported on the lower plate 32L of the raising/lowering frame 32, the shielding member 33 is also lowered. When the shielding member raising/lowering unit 31 lowers the shielding member 33 in a state where the spin base 12 is arranged at such a reference rotational angle that the upper support portions 43 respectively overlap the lower support portions 44 in plan view, the lower end portions of the upper support portions contact the upper end portions of the lower support portions 44. Thus, the upper support portions 43 are respectively supported on the lower support portions 44.

When the shielding member raising/lowering unit 31 lowers the raising/lowering frame 32 after the upper support portions 43 of the shielding member 33 contact the lower support portions 44 of the spin chuck 10, the lower plate 32L of the raising/lowering frame 32 is moved downward with respect to the flange portion 34 of the shielding member 33. Thus, the lower plate 32L is separated from the flange portion 34, and thus the locating protrusions 41 are removed from the locating holes 42. Furthermore, the raising/lowering frame 32 and the center nozzle 45 are moved downward with respect to the shielding member 33, and thus the difference in height between the lower end of the center nozzle 45 and the lower surface 36L of the disc portion 36 of the shielding member 33 is reduced. Here, the raising/lowering frame 32 is arranged at such a height (the lower position which will be described below) that the flange portion 34 of the shielding member 33 does not contact the upper plate 32u of the raising/lowering frame 32.

The shielding member raising/lowering unit 31 locates the raising/lowering frame 32 in an arbitrary position from the upper position (position shown in FIG. 3) to the lower position (position shown in FIG. 2). The upper position is the position in which the locating protrusions 41 are inserted into the locating holes 42 and in which the flange portion 34 of the shielding member 33 contact the lower plate 32L of the raising/lowering frame 32. In other words, the upper position is the position in which the shielding member 33 is suspended from the raising/lowering frame 32. The lower position is the position in which the lower plate 32L is separated from the flange portion 34 and in which the locating protrusions 41 are removed from the locating holes 42. In other words, the lower position is the position in which the coupling of the raising/lowering frame 32 and the shielding member 33 is released and in which the shielding member 33 does not contact any portion of the raising/lowering frame 32.

When the raising/lowering frame 32 and the shielding member 33 are moved to the lower position, the lower ends of the tubular portion 37 of the shielding member 33 are arranged lower than the lower surface of the substrate W, and thus the space between the upper surface of the substrate W and the lower surface 36L of the shielding member 33 is surrounded by the tubular portion 37 of the shielding member 33. Thus, the space between the upper surface of the substrate W and the lower surface 36L of the shielding member 33 is shielded not only from an atmosphere above the shielding member 33 but also from an atmosphere around the shielding member 33. Therefore, it is possible to enhance the sealing performance to seal the space between the upper surface of the substrate W and the lower surface 36L of the shielding member 33.

Furthermore, when the raising/lowering frame 32 and the shielding member 33 are arranged in the lower position, even if the shielding member 33 is rotated around the rotation axis A1, the shielding member 33 is prevented from colliding with the raising/lowering frame 32. When the upper support portions 43 of the shielding member 33 are supported on the lower support portions 44 of the spin chuck 10, the upper support portions 43 and the lower support portions 44 engage with each other, and thus the relative movement of the upper support portions 43 and the lower support portions 44 in the circumferential direction is prevented. When the spin motor 14 rotates in this state, the torque of the spin motor 14 is transmitted to the shielding member 33 via the upper support portions 43 and the lower support portions 44. Thus, the shielding member 33 rotates in the same direction and at the same speed as the spin base 12 in a state where the raising/lowering frame 32 and the center nozzle 45 are stationary.

The center nozzle 45 includes a plurality of liquid discharge ports through which the liquid is discharged and a gas discharge port through which the gas is discharged. The plurality of liquid discharge ports include a chemical liquid discharge port 46 through which a chemical liquid is discharged, an etching liquid discharge port 47 through which an etching liquid is discharged and an upper rinse liquid discharge port 48 through which the rinse liquid is discharged. The gas discharge port is an upper gas discharge port 49 through which an inert gas is discharged. The chemical liquid discharge port 46, the etching liquid discharge port 47, the upper rinse liquid discharge port 48 are open in the lower end of the center nozzle 45. The upper gas discharge port 49 is open in the outer circumferential surface of the center nozzle 45.

The chemical liquid is a liquid which contains at least one of sulfuric acid, nitric acid, hydrochloric acid, hydrofluoric acid, phosphoric acid, acetic acid, ammonia water, hydrogen peroxide water, organic acids (for example, citric acid, oxalic acid), organic alkalis (for example, TMAH: tetramethylammonium hydroxide), a surfactant, a polyhydric alcohol and a corrosion inhibitor, for example. Sulfuric acid, nitric acid, hydrochloric acid, hydrofluoric acid, phosphoric acid, acetic acid, ammonia water, hydrogen peroxide water, citric acid, oxalic acid and TMAH are also etching liquids.

FIG. 2, etc., show an example where the chemical liquid is DHF (dilute hydrofluoric acid). Also, FIG. 2, etc., show the example where the rinse liquid supplied to the center nozzle 45 is pure water and where the inert gas supplied to the center nozzle 45 is nitrogen gas. The rinse liquid supplied to the center nozzle 45 may be a rinse liquid other than pure water. The inert gas supplied to the center nozzle 45 may be an inert gas other than nitrogen gas.

The substrate processing apparatus 1 includes chemical liquid piping 50 which guide the chemical liquid to the center nozzle 45, a chemical liquid valve 51 which is interposed in the chemical liquid piping 50, etching liquid piping 52 which guide the etching liquid to the center nozzle 45, an etching liquid valve 53 which is interposed in the etching liquid piping 52, upper rinse liquid piping 54 which guide the rinse liquid to the center nozzle 45 and an upper rinse liquid valve 55 which is interposed in the upper rinse liquid piping 54. The substrate processing apparatus 1 further includes upper gas piping 56 which guide the gas to the center nozzle 45, an upper gas valve 57 which is interposed in the upper gas piping 56 and an upper gas flow rate adjusting valve 58 which changes the flow rate of the gas supplied from the upper gas piping 56 to the center nozzle 45.

When the chemical liquid valve 51 is opened, the chemical liquid is supplied to the center nozzle 45 and is discharged downward from the chemical liquid discharge port 46 which is open in the lower end of the center nozzle 45. When the etching liquid valve 53 is opened, the etching liquid is supplied to the center nozzle 45 and is discharged downward from the etching liquid discharge port 47 which is open in the lower end of the center nozzle 45. When the upper rinse liquid valve 55 is opened, the rinse liquid is supplied to the center nozzle 45 and is discharged downward from the upper rinse liquid discharge port 48 which is open in the lower end of the center nozzle 45. Thus, the processing liquid such as the chemical liquid is supplied to the upper surface of the substrate W.

When the upper gas valve 57 is opened, the nitrogen gas guided by the upper gas piping 56 is supplied to the center nozzle 45 at a flow rate corresponding to the degree of opening of the upper gas flow rate adjusting valve 58 and is discharged obliquely downward from the upper gas discharge port 49 which is open in the outer circumferential surface of the center nozzle 45. Thereafter, the nitrogen gas flows downward within the upper tubular path 39 while flowing in the circumferential direction within the upper tubular path 39. The nitrogen gas that has reached the lower end of the upper tubular path 39 flows downward from the lower end of the upper tubular path 39. Thereafter, the nitrogen gas flows radially in all directions in the space between the upper surface of the substrate W and the lower surface 36L of the shielding member 33. Thus, the space between the substrate W and the shielding member 33 is filled with the nitrogen gas, and the oxygen concentration in the atmosphere is reduced. The oxygen concentration in the space between the substrate W and the shielding member 33 is changed according to the degree of opening of the upper gas valve 57 and the upper gas flow rate adjusting valve 58. The upper gas valve 57 and the upper gas flow rate adjusting valve 58 are included in the atmosphere oxygen concentration changing unit.

Figure 4:
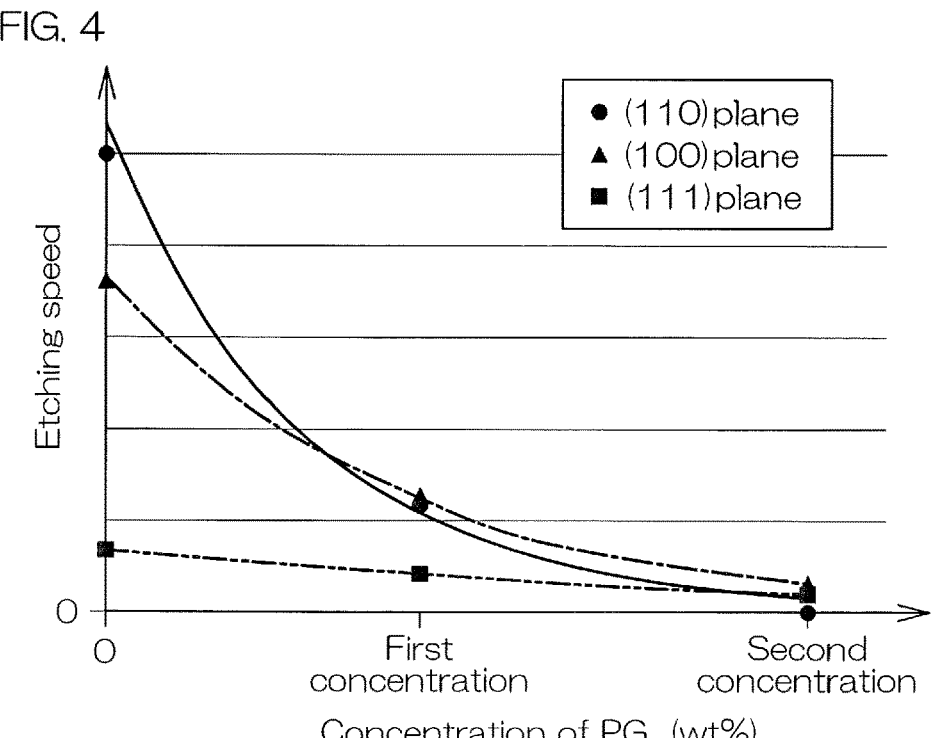
FIG. 4 is a graph showing an example of a relationship between the etching speeds of three crystal planes of silicon and the concentration of propylene glycol in the etching liquid.
Figure 5A:
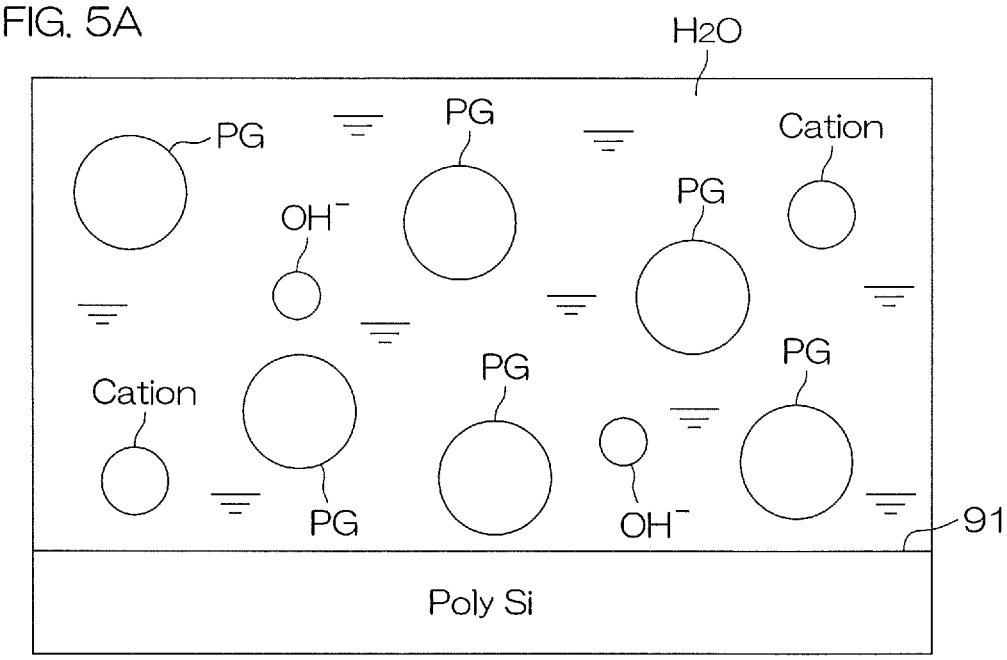
FIG. 5A is a view for describing an assumed mechanism in which the contact between hydroxide ions and polysilicon is inhibited by the chemical compound.
Figure 5B:
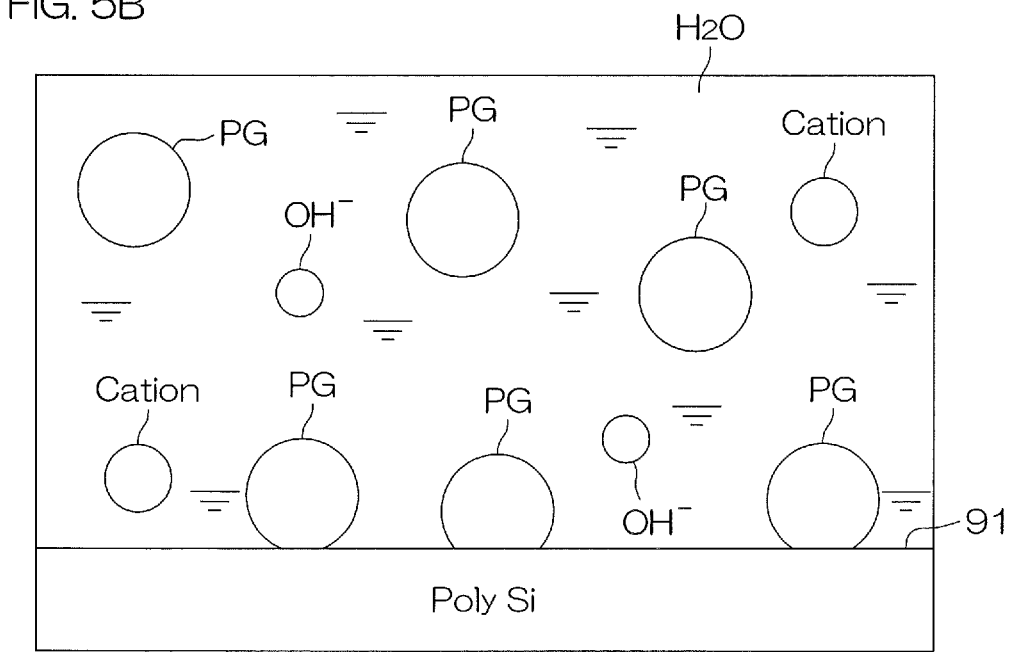
FIG. 5B is a view for describing an assumed mechanism in which the contact between hydroxide ions and polysilicon is inhibited by the chemical compound.

FIG. 4 is a graph showing an example of a relationship between the etching speeds of three crystal planes of silicon and the concentration of propylene glycol in the etching liquid. FIG. 5A and FIG. 5B are views for describing an assumed mechanism in which the contact between hydroxide ions and polysilicon is inhibited by the chemical compound. "PG" in FIG. 4, FIG. 5A and FIG. 5B represents propylene glycol.

The substrate processing apparatus 1 supplies the substrate W with etching liquid, which dissolves a portion of the substrate W by corroding a portion of the substrate W, and a chemical compound, which lowers anisotropy of the etching liquid with respect to silicon single crystal, either separately or pre-mixed.

The etching liquid is alkaline liquid that etches an etching target 91 representing at least one of silicon single crystal and polysilicon (refer to FIG. 5A) and that does not or hardly etches a non-etching target such as silicon oxide or silicon nitride. The pH (hydrogen-ion exponent) of the etching liquid is 12 or higher, for example. If the processing conditions are the same, the etching amount of the etching target 91 per unit time is larger than the etching amount of the non-etching target per unit time.

The etching liquid is liquid that performs anisotropy etching with respect to a silicon single crystal (silicon single crystals in polysilicon are included). That is, if the processing conditions are the same, when the (110) plane, the (100) plane and the (111) plane of silicon are etched by the etching liquid, the etching speed of the (110) plane is the highest and the etching speed of the (111) plane is the lowest. Thus, the etching speed differs for each crystal plane of silicon.

The etching liquid may be solution in which hydroxides of alkali metal such as natrium or kalium are dissolved (NaOH solution or KOH solution), or may be solution such as TMAH in which quaternary ammonium hydroxides are dissolved. The quaternary ammonium hydroxide may be at least one of TMAH, TBAH (Tetrabutylammonium hydroxide), TPeAH (Tetrapentylammonium hydroxide), THAH (Tetrahexylammonium hydroxide), TEAH (Tetraethylammonium hydroxide), TPAH (Tetrapropylammonium hydroxide) and choline hydroxide, or may be other than these. These are all included in organic alkalis. Note that in this paragraph, TMAH refers to an anhydride, not an aqueous solution. The same applies to other quaternary ammonium hydroxides such as TBAH.

When a quaternary ammonium hydroxide dissolves in water, the quaternary ammonium hydroxide separates into a positive ion (a cation) and a hydroxide ion. Thus, there is the hydroxide ion in the solution of the quaternary ammonium hydroxide. Similarly, there is the hydroxide ion in the solution of the alkali metal hydroxide such as natrium or kalium. The chemical compound supplied to the substrate W is an inhibitor that inhibits contact between the hydroxide ion and the etching target 91. The molecule of the inhibitor is preferably larger than the hydroxide ion. The inhibitor is also preferably a water-soluble substance that dissolves in water. The inhibitor may be a surfactant including both of hydrophilic groups and hydrophobic groups. As long as it is uniformly dispersed in the etching liquid, the inhibitor may be an insoluble substance that does not dissolve in water.

The etching liquid is supplied to the substrate W with or without being mixed with the chemical compound. The chemical compound is a substance that dissolves in the etching liquid. In the following, an example in which the compound is the first chemical compound and the second chemical compound will be described. The first chemical compound and the second chemical compound are different substances. The first chemical compound is glycol, for example. The second chemical compound is ether, for example. The first chemical compound and the second chemical compound may be substances other than glycols and ethers, such as glycerin.

The glycol may be any of ethylene glycol, diethylene glycol and propylene glycol. The glycol is preferably propylene glycol. The glycol is an example of a substance that is not involved in the reaction between silicon (Si) and hydroxide ion ($OH^-$). That is, the glycol is an example of a substance that does not react with atoms etc., involved in the reaction between silicon and hydroxide ion. The glycol is an example of a substance that does not act as a catalyst in this reaction.

In a case where alkaline etching liquid containing the chemical compound (mixed liquid of the chemical compound, the hydroxide, and water) is supplied to the substrate W, the concentration of the hydroxide such as TMAH is 0.1 to 25 wt %, for example, and the concentration of the chemical compound is 0.001 to 40 wt %, for example. The concentration of the quaternary ammonium hydroxide is preferably 0.25 to 20 wt %. The concentration of the chemical compound is preferably 0.5 to 30 wt %.

FIG. 5A and FIG. 5B show examples where the etching liquid containing propylene glycol which is an example of the chemical compound (the mixed liquid of the etching liquid and propylene glycol) is supplied to polysilicon which is an example of the etching target 91. "Cation" and "$OH^-$" in FIG. 5A and FIG. 5B are ones into which the hydroxide contained in the etching liquid (alkali metal hydroxides or quaternary ammonium hydroxide) separates.

The silicon contained in the etching target 91 such as polysilicon reacts with the hydroxide ion as represented by the formula "$Si+4OH^-\rightarrow Si(OH)_4+4e^-$." Thus, the silicon contained in the etching target 91 dissolves in the etching liquid and etching of the etching target 91 progresses. The chemical compound contained in the etching liquid becomes a steric obstacle for the hydroxide ion. That is, the chemical compound drifting in the etching liquid or the chemical compound adsorbed or coordinated to the polysilicon blocks the movement of the hydroxide ion in the etching liquid toward the polysilicon. Thus, the number of the hydroxide ions that reach the polysilicon decreases and the etching speed of the polysilicon is lowered. It is thought that by such a mechanism the contact between the hydroxide ion and the polysilicon is inhibited by the chemical compound.

Although decrease in etching speed occurs on a plurality of crystal planes of silicon contained in polysilicon, the etching speed decreases relatively greatly in a crystal plane having a high etching speed among the plurality of crystal planes of silicon. Thus, the difference in etching speed between the plurality of crystal planes is reduced, and anisotropy of etching liquid with respect to silicon single crystal is lowered. That is, the polysilicon is uniformly etched regardless of plane directions of silicon exposed at the surface of the polysilicon. It is thought that by such a mechanism the polysilicon is etched with a uniform etching amount at every position.

FIG. 4 shows measured values of etching speeds of the (110) plane, the (100) plane, and the (111) plane when silicon single crystal is etched using three types of TMAH (concentration zero, the first concentration, the second concentration) which are different in concentration of propylene glycol. The etching conditions in which the measured values shown in FIG. 4 are obtained are identical except for the concentration of the propylene glycol in TMAH. For example, the temperature of TMAH is 40 degrees Celsius and the concentration of TMAH in which propylene glycol is not added is 5 wt % (mass percent concentration). The dissolved oxygen concentration of TMAH is lowered in advance.

As shown in FIG. 4, when the concentration of the propylene glycol is zero, the etching speed of the (110) plane is highest and the etching speed of the (111) plane is lowest. As can be seen from the three curves in FIG. 4, adding propylene glycol to TMAH reduces the etching speed. Further, the etching speed of any crystal plane decreases as the concentration of propylene glycol increases.

However, in the range of the concentration of the propylene glycol from zero to the first concentration, the etching speeds of the (110) plane and the (100) plane sharply decrease, while the etching speed of the (111) plane decreases very slowly. Thus, in this range, the difference between the maximum value of the etching speed and the minimum value of the etching speed decreases as the concentration of the propylene glycol increases.

When the concentration of the propylene glycol exceeds the first concentration, although a decrease ratio of the etching speed (a ratio of absolute value of change in etching speed to absolute value of change in concentration of propylene glycol) is lowered, the decrease ratios of the etching speeds of the (110) plane and the (100) plane are larger than the decrease ratio of the etching speed of the (111) plane until a value near the middle between the first concentration and the second concentration. Thus, the difference between the maximum value of the etching speed and the minimum value of the etching speed is also decreasing in the range of the concentration of the propylene glycol to the value near the middle between the first concentration and the second concentration.

In this way, when propylene glycol is added to TMAH that shows anisotropy with respect to silicon single crystal, plane direction selectivity, that is, the difference between the maximum value of the etching speed and the minimum value of the etching speed decreases and anisotropy of TMAH with respect to silicon single crystal is lowered. On the other side, in the range of the concentration of the propylene glycol to the value near the middle between the first concentration and the second concentration, the etching speeds of the (110) plane and the (100) plane decrease at a large decrease ratio as the concentration of the propylene glycol increases. Thus, the concentration of the propylene glycol may be set in accordance with the required etching uniformity and etching speed.

For example, the inhibitor such as propylene glycol may be administered excessively to the etching liquid. According to the measured result shown in FIG. 4, the effect of the mitigation of anisotropy is relatively small when the propylene glycol is added at a small amount (for example, about 5 to 10 wt %), but the remarkable effect of the mitigation of anisotropy is recognized when the propylene glycol is added at a large amount (for example, 20 wt % or more), that is, the propylene glycol is administered excessively. On the other side, since the etching speed is lowered, the concentration of the propylene glycol may be selected in accordance with the required quality and the allowable processing time.

The tendency shown in FIG. 4 was also observed for combinations other than TMAH and propylene glycol. Thus, the etching liquid is not restricted to TMAH, and the chemical compound is not restricted to propylene glycol. It is assumed that the tendency shown in FIG. 4 is also observed not only when the etching liquid containing the chemical compound is supplied to the etching target 91, but also when the chemical compound and the etching liquid are separately supplied to the substrate W and mixed on the etching target 91. Thus, the chemical compound and the etching liquid may be separately supplied to the substrate W.

The chemical compound supplied to the substrate W may be one of the first chemical compound and the second chemical compound, or may be both of the first chemical compound and the second chemical compound. In the former case, the etching liquid and the first chemical compound is supplied to the etching target 91, and after or before that the etching liquid and the second chemical compound may be supplied to the etching target 91. That is, both of the first chemical compound and the second chemical compound may exist on the etching target 91 only when liquid on the etching target 9 is being replaced with another liquid. In the latter case, the etching liquid containing the first chemical compound and the second chemical compound may be supplied to the etching target 91, or the first chemical compound, the second chemical compound and the etching liquid may be mixed on the etching target 91.

In a case in which the chemical compound supplied to the substrate W is one the first chemical compound and the second chemical compound, two or more chemical compounds belonging to the first chemical compound or the second chemical compound may be supplied to the etching target 91. For example, two or more chemical compounds belonging to the first chemical compound may be supplied to the etching target 91. In this case, the etching liquid containing all of the chemical compounds may be supplied to the etching target 91, or all of the chemical compounds and the etching liquid are mixed on the etching target 91. Alternatively, the etching liquid containing some of the chemical compounds is supplied to the etching target 91, and after or before that the remainder of the chemical compound may be supplied to the etching target 91.

If the conditions other than the type of the chemical compound (including a combination of the chemical compounds when supplying two or more the chemical compounds) are the same, when the type of the chemical compound supplied to the etching target 91 is different, at least one of the etching speeds of the (110) plane, the (100) plane and the (111) plane of silicon is different. Thus, the type of the chemical compound may be selected in accordance with the required quality and the allowable processing time.

In a case in which the etching liquid is supplied to the etching target 91 without supplying the chemical compound to the etching target 91, when the temperature of the etching liquid is raised, the etching speeds of the (110) plane and the (100) plane increase at an amount of change larger than an amount of change of the etching speed of the (111) plane. Also, in this case, when the temperature of the etching liquid is lowered, the etching speeds of the (110) plane and the (100) plane are lowered at an amount of change larger than an amount of change of the etching speed of the (111) plane.

Thus, in a case in which the etching liquid is supplied to the etching target 91 without supplying the chemical compound to the etching target 91, when the temperature of the etching liquid is raised, the difference between the minimum value and the maximum value of etching speeds of silicon increases. On the contrary, in a case in which the etching liquid is supplied to the etching target 91 without supplying the chemical compound to the etching target 91, when the temperature of the etching liquid is lowered, the difference between the minimum value and the maximum value of etching speeds of silicon decreases. These phenomena also occur when the etching liquid and the chemical compound are supplied to the etching target 91. Thus, the temperatures of the etching liquid and the chemical compound may be set in accordance with the required quality and the allowable processing time.

Figure 6:
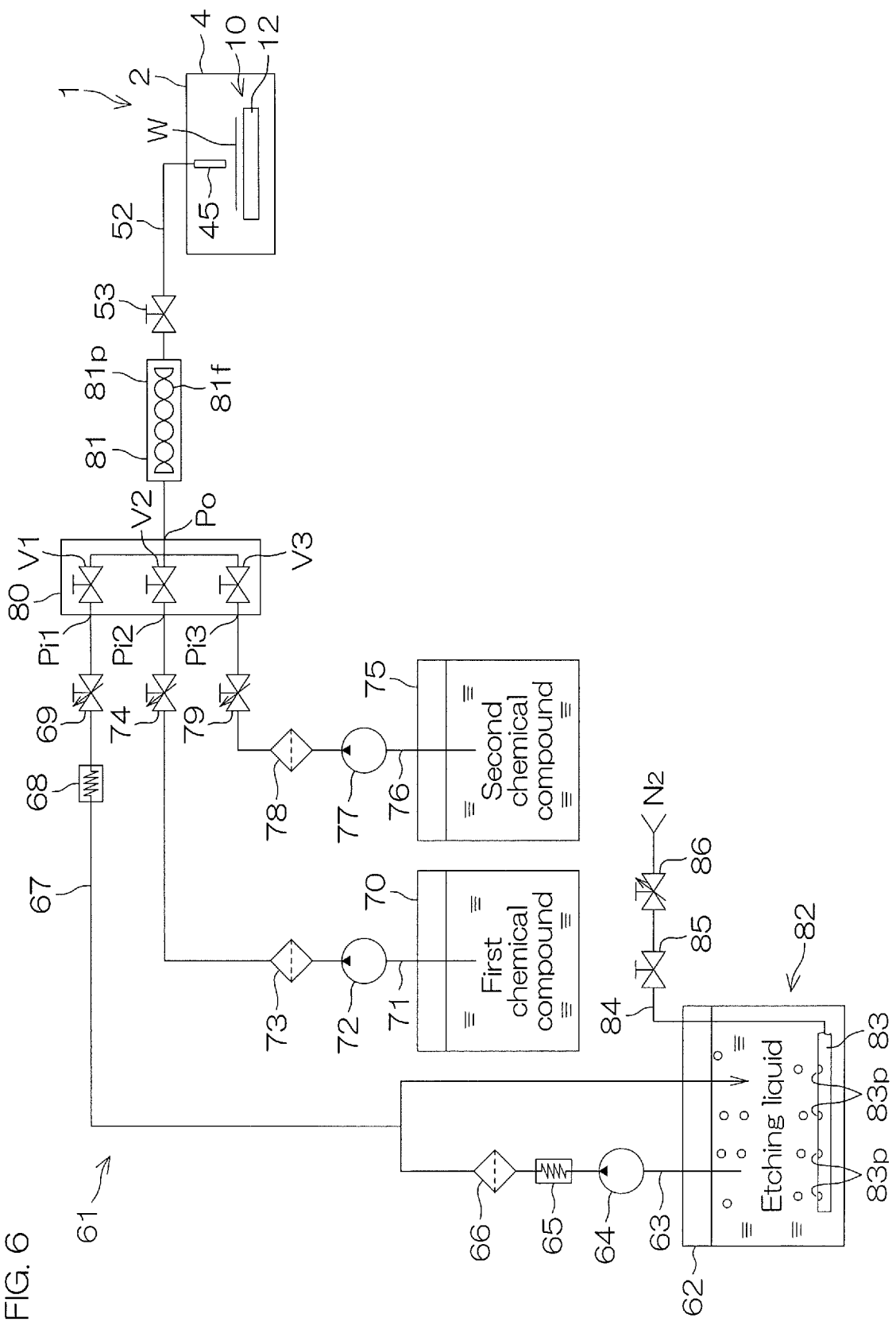
FIG. 6 is a schematic view showing a processing liquid supplying unit of the substrate processing apparatus that supplies the substrate with the processing liquid such as the etching liquid.

FIG. 6 is a schematic view showing a processing liquid supplying unit 61 of the substrate processing apparatus 1 that supplies the substrate W with the processing liquid such as the etching liquid. FIG. 6 shows an example in which the etching liquid is mixed with the chemical compound before being supplied to the substrate W.

The substrate processing apparatus 1 includes the processing liquid supplying unit 61 that supplies the substrate W with the processing liquid such as the etching liquid. The center nozzle 45, the etching liquid piping 52, the etching liquid valve 53, etc., described above are included in the processing liquid supplying unit 61.

The processing liquid supplying unit 61 includes, in addition to the center nozzle 45 and so on, an etching liquid tank 62 that stores the etching liquid, a first chemical compound tank 70 that stores first chemical-compound-containing liquid containing the first chemical compound which is an example of the chemical compound and a second chemical compound tank 75 that stores second chemical-compound-containing liquid containing the second chemical compound which is another example of the chemical compound. The first chemical-compound-containing liquid may be a liquid (melt) of the first chemical compound or may be a solution of the first chemical compound. When the first compound-containing liquid is a solution of the first compound, the solvent may be water or a liquid other than water such as the etching liquid. The same applies to the second chemical-compound-containing liquid.

The etching liquid in the etching liquid tank 62 is supplied to the center nozzle 45 via a mixing valve 80. Similarly, the first chemical-compound-containing liquid in the first chemical compound tank 70 is supplied to the center nozzle 45 via the mixing valve 80, and the second chemical-compound-containing liquid in the second chemical compound tank 75 is supplied to the center nozzle 45 via the mixing valve 80. When the etching liquid containing at least one of the first chemical compound and the second chemical compound is discharged from the center nozzle 45, at least one of the first chemical-compound-containing liquid and the second chemical-compound-containing liquid and the etching liquid are supplied to the mixing valve 80 and mixed in the mixing valve 80.

The processing liquid supplying unit 61 may include an inline mixer 81 that stirs the etching liquid that has passed through the mixing valve 80 and contains at least one of the first chemical compound and the second chemical compound before being discharged from the center nozzle 45. FIG. 6 shows an example in which the inline mixer 81 is disposed upstream of the etching liquid valve 53. The inline mixer 81 is a static mixer that includes a pipe 81*p* interposed in an upstream etching liquid piping 67 and a stirring fin 81*f* disposed in the pipe 81*p* and twisted around an axis extending a flow direction of liquid.

The processing liquid supplying unit 61 includes circulation piping 63 that circulate the etching liquid in the etching liquid tank 62, a circulation pump 64 that sends the etching liquid in the etching liquid tank 62 to the circulation piping 63, a filter 66 that removes foreign matters such as particles from the etching liquid returning to the etching liquid tank 62, and a temperature controller 65 that changes the temperature of the etching liquid in the etching liquid tank 62 by heating or cooling the etching liquid.

The circulation pump 64 always sends the etching liquid in the etching liquid tank 62 into the circulation piping 63. The etching liquid in the etching liquid tank 62 flows in the circulation piping 63 through the upstream end of the circulation piping 63 and returns to the etching liquid tank 62 through the downstream end of the circulation piping 63. Thus, the etching liquid circulates in a circulation path that is formed by the etching liquid tank 62 and the circulation piping 63.

The temperature controller 65 maintains the temperature of the etching liquid in the etching liquid tank 62 at a constant temperature higher or lower than a room temperature (for example, 20 to 30 degrees Celsius). The temperature controller 65 may be interposed in the circulation piping 63, or may be disposed in the etching liquid tank 62. FIG. 6 shows an example of the former. The temperature controller 65 may be a heater that heats liquid at a temperature higher than the room temperature, or may be a cooler that cools liquid at a temperature lower than the room temperature, or may have both heating and cooling functions.

The processing liquid supplying unit 61 further includes the upstream etching liquid piping 67 that guide the etching liquid toward the center nozzle 45 from the circulation piping 63, a flow rate adjusting valve 69 that changes the flow rate of the etching liquid flowing downstream in the upstream etching liquid piping 67, and an inline heater 68 that heats the etching liquid that has flowed in the upstream etching liquid piping 67.

The etching liquid in the circulation piping 63 flows in the upstream etching liquid piping 67 through the upstream end of the upstream etching liquid piping 67 and is supplied to the mixing valve 80 through the downstream end of the upstream etching liquid piping 67. At this time, the etching liquid is supplied to the mixing valve 80 at a flow rate corresponding to the degree of opening of the flow rate adjusting valve 69. When the etching liquid having the temperature higher than the temperature of the etching liquid in the etching liquid tank 62 is supplied to the mixing valve 80, the etching liquid is supplied to the mixing valve 80 after being heated by the inline heater 68.

The substrate processing apparatus 1 may include the dissolved oxygen concentration changing unit 82 that adjusts the dissolved oxygen concentration of the etching liquid. The dissolved oxygen concentration changing unit 82 includes gas piping 83 that dissolve gas in the etching liquid in the etching liquid tank 62 by supplying gas into the etching liquid tank 62. The dissolved oxygen concentration changing unit 82 further includes inert gas piping 84 that supply inert gas to the gas piping 83, an inert gas valve 85 that opens and closes between an open state where inert gas flows from the inert gas piping 84 to the gas piping 83 and a close state where inert gas is stopped at the inert gas piping 84, and a flow rate adjusting valve 86 that changes a flow rate of inert gas to be supplied to the gas piping 83 from the inert gas piping 84.

The gas piping 83 is bubbling piping that include gas discharge ports 83$p$ disposed in the etching liquid in the etching liquid tank 62. When the inert gas valve 85 is opened, that is, when the inert gas valve 85 is switched from the closed state to the opened state, inert gas such as nitrogen gas is discharged from the gas discharge ports 83$p$ at a flow rate corresponding to the degree of opening of the flow rate adjusting valve 86. Thus, a large number of air bubbles are formed in the etching liquid in the etching liquid tank 62, and inert gas is dissolved in the etching liquid in the etching liquid tank 62. Here, the dissolved oxygen is discharged from the etching liquid, and the dissolved oxygen concentration of the etching liquid is lowered. The dissolved oxygen concentration of the etching liquid in the etching liquid tank 62 is changed by changing the flow rate of the nitrogen gas discharged from the gas discharge ports 83$p$.

The processing liquid supplying unit 61 includes first chemical compound piping 71 that guide the first chemical-compound-containing liquid toward the center nozzle 45 from the first chemical compound tank 70, a first chemical compound pump 72 that sends the first chemical-compound-containing liquid in the first chemical compound tank 70 to the first chemical compound piping 71, a filter 73 that removes foreign matters such as particles from the first chemical-compound-containing liquid flowing toward the center nozzle 45, and a flow rate adjusting valve 74 that changes the flow rate of the first chemical-compound-containing liquid flowing downstream in the first chemical compound piping 71.

The processing liquid supplying unit 61 further includes second chemical compound piping 76 that guide the second chemical-compound-containing liquid toward the center nozzle 45 from the second chemical compound tank 75, a second chemical compound pump 77 that sends the second chemical-compound-containing liquid in the second chemical compound tank 75 to the second chemical compound piping 76, a filter 78 that removes foreign matters such as particles from the second chemical-compound-containing liquid flowing toward the center nozzle 45, and a flow rate adjusting valve 79 that changes the flow rate of the second chemical-compound-containing liquid flowing downstream in the second chemical compound piping 76.

When the first chemical-compound-containing liquid in the first chemical compound tank 70 is circulated, a configuration similar to that of the etching liquid may be adopted. That is, the circulation pipe 63 and the circulation pump 64 for the first chemical-compound-containing liquid may be provided. When the first chemical-compound-containing liquid having a temperature higher or lower than room temperature is supplied to the mixing valve 80, at least one of the temperature controller 65 and the inline heater 68 for the first chemical-compound-containing liquid may be provided. When the dissolved oxygen concentration of the first chemical-compound-containing liquid is lowered, the gas piping 83 and so on for the first chemical-compound-containing liquid may be provided. The same applies to the second chemical-compound-containing liquid.

The mixing valve 80 includes a plurality of valves that are individually openable and closable and a plurality of flow paths that are connected to the plurality of valves. FIG. 6 shows an example in which the mixing valve 80 includes three valves (the first valve V1, the second valve V2, and the third valve V3), three inflow ports (the first inflow port Pi1, the second inflow port Pi2, and the third inflow port Pi3), and an outflow port Po. The upstream etching liquid piping 67 is connected to the first inflow port Pi1. The first chemical compound piping 71 is connected to the second inflow port Pi2, and the second chemical compound piping 76 is connected to the third inflow port Pi3. The etching liquid piping 52 is connected to the outflow port Po.

When the first valve V1 is opened, the etching liquid in the upstream etching liquid piping 67 flows into the mixing valve 80 through the first inflow port Pi and is discharged to the etching liquid piping 52 from the outflow port Po. Similarly, when the second valve V2 is opened, the first chemical-compound-containing liquid in the first chemical compound piping 71 flows into the mixing valve 80 through the second inflow port Pi2 and is discharged to the etching liquid piping 52 from the outflow port Po. When the third valve V3 is opened, the second chemical-compound-containing liquid in the second chemical compound piping 76 flows into the mixing valve 80 through the third inflow port Pi3 and is discharged to the etching liquid piping 52 from the outflow port Po.

For example when the first valve V1 and the second valve V2 are opened, the etching liquid is supplied to the mixing valve 80 at a flow rate corresponding to the degree of opening of the flow rate adjusting valve 69, and the first chemical-compound-containing liquid is supplied to the mixing valve 80 at a flow rate corresponding to the degree of opening of the flow rate adjusting valve 74. Thus, the etching liquid containing the first chemical compound is supplied to the etching liquid piping 52 from the mixing valve 80 and discharged toward the substrate W from the center nozzle 45. The concentration of the first chemical compound in the etching liquid discharged from the center nozzle 45 is changed by the flow rate adjusting valve 69 and the flow rate adjusting valve 74. The temperature of the etching liquid containing the first chemical compound and discharged from the center nozzle 45 is changed by the temperature controller 65 and the inline heater 68.

Figure 7:
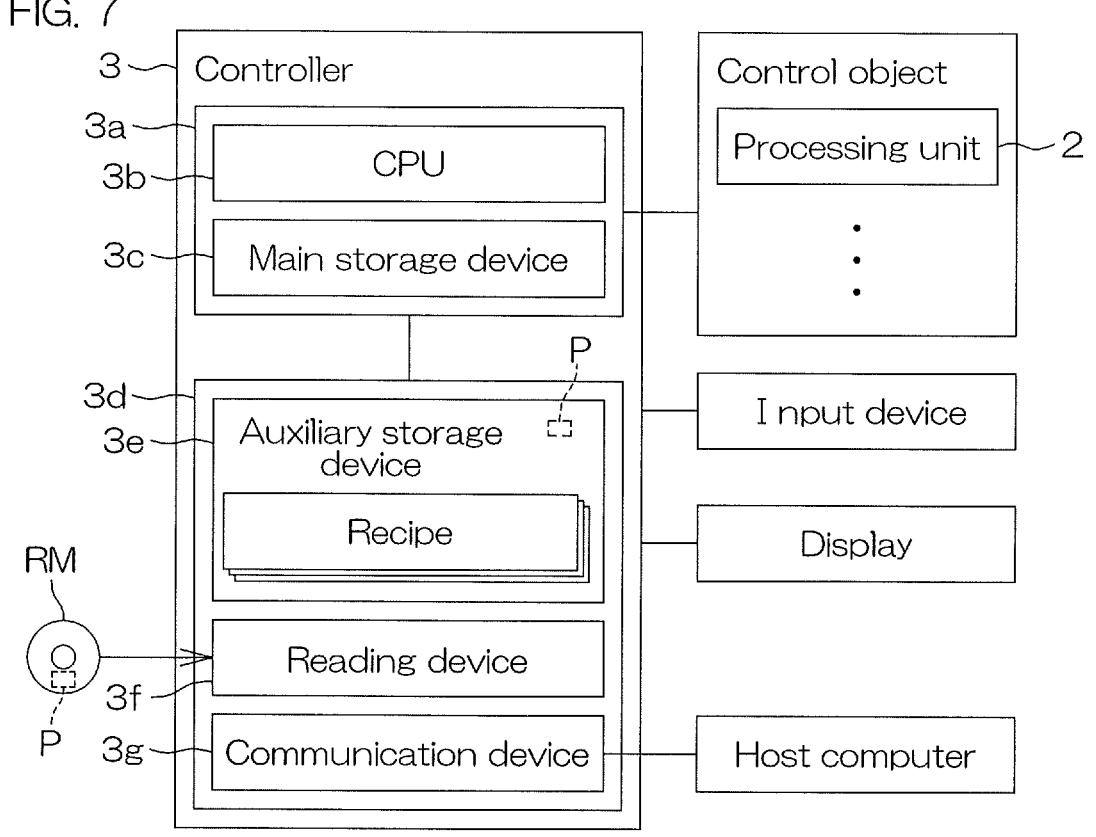
FIG. 7 is a block diagram showing an electrical arrangement of the substrate processing apparatus.

FIG. 7 is a block diagram showing an electrical arrangement of the substrate processing apparatus 1.

The controller 3 is a computer which includes a computer main body 3a and a peripheral device 3d which is connected to the computer main body 3a. The computer main body 3a includes a CPU 3b (central processing unit) which executes various types of commands and a main storage device 3c which stores information. The peripheral device 3d includes an auxiliary storage device 3e which stores information such as a program P, a reading device 3f which reads information from a removable medium RM and a communication device 3g which communicates with other devices such as a host computer.

The controller 3 is connected to an input device and a display. The input device is operated when an operator such as a user or a maintenance operator inputs information to the substrate processing apparatus 1. The information is displayed on the screen of the display. The input device may be any one of a keyboard, a pointing device and a touch panel or may be a device other than those. A touch panel display which serves both as the input device and the display may be provided in the substrate processing apparatus 1.

The CPU 3b executes the program P stored in the auxiliary storage device 3e. The program P within the auxiliary storage device 3e may be previously installed in the controller 3, may be fed through the reading device 3f from the removable medium RM to the auxiliary storage device 3e or may be fed from an external device such as the host computer to the auxiliary storage device 3e through the communication device 3g.

The auxiliary storage device 3e and the removable medium RM are nonvolatile memories which retain memory even without power being supplied. The auxiliary storage device 3e is, for example, a magnetic storage device such as a hard disk drive. The removable medium RM is, for example, an optical disc such as a compact disc or a semiconductor memory such as a memory card. The removable medium RM is an example of a computer readable recording medium in which the program P is recorded. The removable medium RM is a non-transitory tangible recording medium (non-transitory tangible media).

The auxiliary storage device 3e stores a plurality of recipes. The recipe is information which specifies the details of processing, processing conditions and processing procedures of the substrate W. A plurality of recipes differ from each other in at least one of the details of processing, the processing conditions and the processing procedures of the substrate W. The controller 3 controls the substrate processing apparatus 1 such that the substrate W is processed in accordance with the recipe designated by the host computer. The controller 3 is programmed to execute the individual steps described below.

Figure 8:
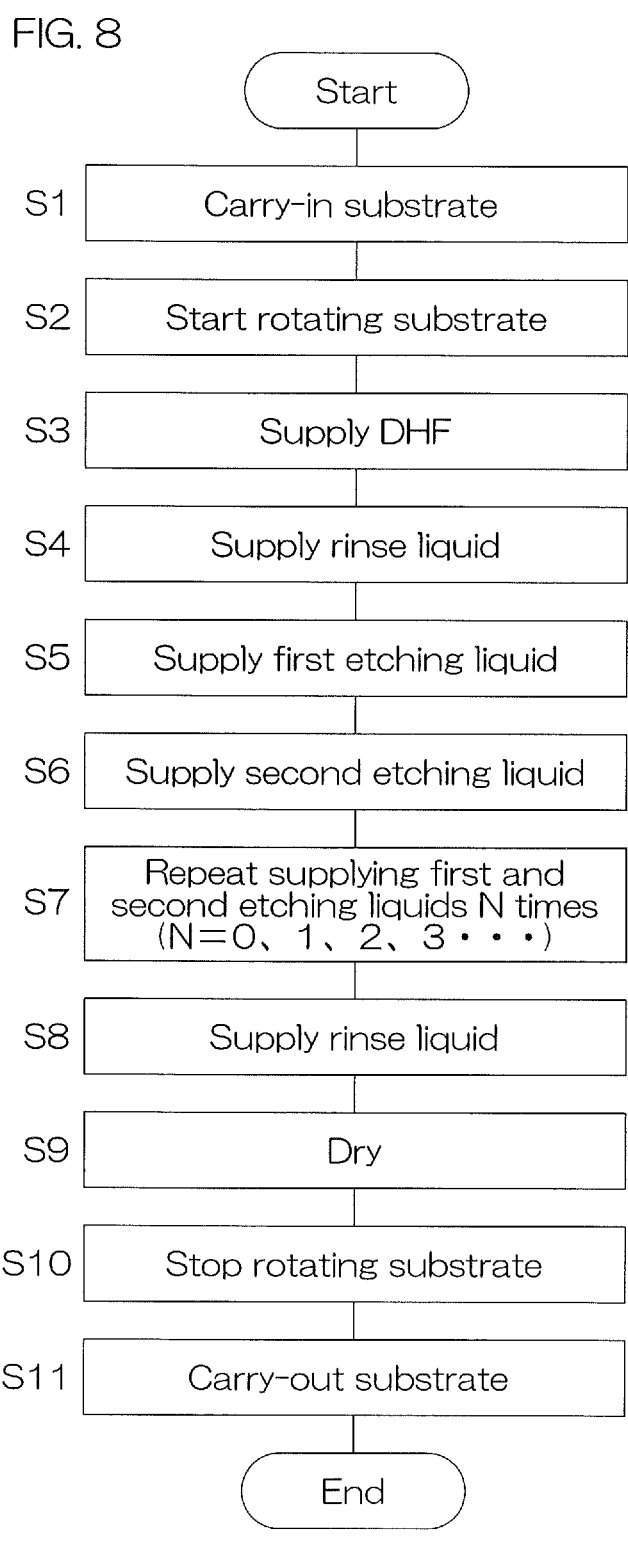
FIG. 8 is a process chart for describing an example of the processing of the substrate which is executed by the substrate processing apparatus.

FIG. 8 is a process chart for describing an example of the processing of the substrate W which is executed by the substrate processing apparatus 1. Reference is hereinafter made to FIG. 1A, FIG. 2, FIG. 3, FIG. 6 and FIG. 8.

When the substrate W is processed by the substrate processing apparatus 1, a carry-in step of carrying the substrate W into the chamber 4 is performed (step S1 in FIG. 8).

Specifically, in a state where the raising/lowering frame 32 and the shielding member 33 are positioned in the upper position and where all the guards 25 are positioned in the lower position, the center robot CR causes the hand H1 to enter the chamber 4 while supporting the substrate W with the hand H1. Then, the center robot CR places, on the chuck pins 11, the substrate W on the hand H1 with the front surface of the substrate W directed upward. Thereafter, the chuck pins 11 are pressed onto the outer circumferential surface of the substrate W, and thus the substrate W is grasped. The center robot CR places the substrate W on the spin chuck 10 and thereafter retracts the hand H1 from the inside of the chamber 4.

Next, the upper gas valve 57 and the lower gas valve 21 are opened, and thus the upper central opening 38 of the shielding member 33 and the lower central opening 18 of the spin base 12 start the discharge of the nitrogen gas. Thus, the oxygen concentration in the atmosphere in contact with the substrate W is reduced. Furthermore, the shielding member raising/lowering unit 31 lowers the raising/lowering frame 32 from the upper position to the lower position, and the guard raising/lowering unit 27 raises any one of the guards 25 from the lower position to the upper position. Here, the spin base 12 is held at such a reference rotational angle where the upper support portions 43 respectively overlap the lower support portions 44 in plan view. Thus, the upper support portions 43 of the shielding member 33 are supported on the lower support portions 44 of the spin base 12, and the shielding member 33 is separated from the raising/lowering frame 32. Thereafter, the spin motor 14 is driven to start the rotation of the substrate W (step S2 in FIG. 8).

Next, a chemical liquid supplying step of supplying the upper surface of the substrate W with DHF which is an example of the chemical liquid is performed (step S3 in FIG. 8).

Specifically, in a state where the shielding member 33 is positioned in the lower position, the chemical liquid valve 51 is opened, and thus the center nozzle 45 starts the discharge of the DHF. The DHF discharged from the center nozzle 45 hits the central portion of the upper surface of the substrate W and thereafter flows outward along the upper surface of the substrate W which is being rotated. Thus, a liquid film of the DHF which covers the entire region of the upper surface of the substrate W is formed, and the DHF is supplied to the entire region of the upper surface of the substrate W. When a predetermined time has elapsed since the chemical liquid valve 51 is opened, the chemical liquid valve 51 is closed, and the discharge of the DHF is stopped.

Next, a first rinse liquid supplying step of supplying the upper surface of the substrate W with pure water which is an example of the rinse liquid is performed (step S4 in FIG. 8).

Specifically, in a state where the shielding member 33 is positioned in the lower position, the upper rinse liquid valve 55 is opened, and thus the center nozzle 45 starts the discharge of the pure water. The pure water that has hit the central portion of the upper surface of the substrate W flows outward along the upper surface of the substrate W that is being rotated. The DHF on the substrate W is rinsed off by the pure water discharged from the center nozzle 45. Thus, a liquid film of the pure water which covers the entire region of the upper surface of the substrate W is formed. When a predetermined time has elapsed since the upper rinse liquid valve 55 is opened, the upper rinse liquid valve 55 is closed, and the discharge of the pure water is stopped.

Next, a first etching step of supplying the upper surface of the substrate W with first etching liquid which is an example of the etching liquid is performed (step S5 in FIG. 8).

Specifically, in a state where the shielding member 33 is positioned at the lower position, the first valve V1 and the second valve V2 of the mixing valve 80 are opened, and the etching liquid valve 53 is opened. Thus, the first etching liquid, that is, the etching liquid containing the first chemical compound is supplied to the center nozzle 45, and the center nozzle 45 starts to discharge the first etching liquid. Before the start of the discharge of the first etching liquid, in order to switch the guards 25 which receive the liquid discharged from the substrate W, the guard raising/lowering unit 27 may vertically move at least one of the guards 25. The first etching liquid that has hit the central portion of the upper surface of the substrate W flows outward along the upper surface of the substrate W that is being rotated. The pure water on the substrate W is replaced by the first etching liquid discharged from the center nozzle 45. Thus, a liquid film of the first etching liquid which covers the entire region of the upper surface of the substrate W is formed.

After the liquid film of the first etching liquid is formed, a second etching step of supplying the upper surface of the substrate W with second etching liquid which is another example of the etching liquid (step S6 in FIG. 8).

Specifically, the first valve V1 of the mixing valve 80 and the etching liquid valve 53 remain open, the second valve V2 of the mixing valve 80 is closed and the third valve V3 of the mixing valve 80 is opened. At this time, if necessary, the degree of opening of the flow rate adjusting valve 69 (refer to FIG. 6) may be changed. When the second valve V2 of the mixing valve 80 is closed and the third valve V3 of the mixing valve 80 is opened, the supply of the first chemical-compound-containing liquid to the mixing valve 80 is stopped and the supply of the second chemical-compound-containing liquid to the mixing valve 80 is started. Thus, the second etching liquid, that is, the etching liquid containing the second chemical compound is supplied to the center nozzle 45, and the center nozzle 45 starts to discharge the second etching liquid. Before the start of the discharge of the second etching liquid, in order to switch the guards 25 which receive the liquid discharged from the substrate W, the guard raising/lowering unit 27 may vertically move at least one of the guards 25.

The second etching liquid is discharged toward the central portion of the upper surface of the substrate W from the center nozzle 45 in a state where the shielding member 33 is positioned at the lower position. The second etching liquid that has hit the central portion of the upper surface of the substrate W flows outward along the upper surface of the substrate W which is being rotated. The first etching liquid on the substrate W is replaced with the second etching liquid discharged from the center nozzle 45. Thus, a liquid film of the second etching liquid which covers the entire region of the upper surface of the substrate W is formed.

After the liquid film of the second etching liquid is formed, the first etching liquid may be supplied to the substrate W again and then the second etching liquid may be supplied to the substrate W. That is, one cycle from the first etching step (step S5 in FIG. 8) to the second etching step (step S6 in FIG. 8) may be performed two or more times (step S7 "N" in FIG. 8). Step S7 "N" in FIG. 8 refers to an integer greater than or equal to 0. When the N is greater than or equal to 1, the repetitive cycle is performed two or more times. When the N is 0, only the first etching step and the second etching step for the first time are performed, and second and subsequent first etching steps and second etching steps are not performed.

After the final second etching step is started and the liquid film of the second etching liquid covering the entire region of the upper surface of the substrate W is formed, all the valves of the mixing valve 80 (the first valve V1, the second valve V2 and the third valve V3) are closed and the etching liquid valve 53 is closed. Thus, the discharge of the second etching liquid from the center nozzle 45 is stopped in a state where the entire region of the upper surface of the substrate W is covered with the liquid film of the second etching liquid.

Next, a second rinse liquid supplying step of supplying the upper surface of the substrate W with pure water which is an example of the rinse liquid is performed (step S8 in FIG. 8).

Specifically, in the state where the shielding member 33 is positioned in the lower position, the upper rinse liquid valve 55 is opened, and thus the center nozzle 45 starts the discharge of the pure water. The pure water that has hit the central portion of the upper surface of the substrate W flows outward along the upper surface of the substrate W that is being rotated. The second etching liquid on the substrate W is rinsed off by the pure water discharged from the center nozzle 45. Thus, a liquid film of the pure water which covers the entire region of the upper surface of the substrate W is formed. When a predetermined time has elapsed since the upper rinse liquid valve 55 is opened, the upper rinse liquid valve 55 is closed, and the discharge of the pure water is stopped.

Next, a drying step of drying the substrate W by the rotation of the substrate W is performed (step S9 in FIG. 8).

Specifically, in the state where the shielding member 33 is positioned in the lower position, the spin motor 14 accelerates the substrate W in the rotation direction so as to rotate the substrate W at a high rotational speed (for example, several thousands of rpm) higher than the rotational speed of the substrate W in a period from the chemical liquid supplying step to the second rinse liquid supplying step. Thus, the liquid is removed from the substrate W, and thus the substrate W is dried. When a predetermined time has elapsed since the high-speed rotation of the substrate W is started, the spin motor 14 stops the rotation. Here, the spin motor 14 stops the spin base 12 at the reference rotational angle. Thus, the rotation of the substrate W is stopped (step S10 in FIG. 8).

Next, a carry-out step of carrying the substrate W out from the chamber 4 is performed (step S11 in FIG. 8).

Specifically, the shielding member raising/lowering unit 31 raises the raising/lowering frame 32 to the upper position, and the guard raising/lowering unit 27 lowers all the guards 25 to the lower position. Furthermore, the upper gas valve 57 and the lower gas valve 21 are closed, and thus the upper central opening 38 of the shielding member 33 and the lower central opening 18 of the spin base 12 stop the discharge of the nitrogen gas. Thereafter, the center robot CR causes the hand H1 to enter the chamber 4. After the chuck pins 11 release the grasping of the substrate W, the center robot CR supports the substrate W on the spin chuck 10 with the hand H1. Thereafter, the center robot CR retracts the hand H1 from the inside of the chamber 4 while supporting the substrate W with the hand H1. Thus, the processed substrate W is carried out from the chamber 4.

The following table 1 shows a plurality of examples of the processing of substrates W performed by the substrate processing apparatus 1. "Chemical compound X" in the table represents at least one of the first chemical compound and the second chemical compound, "+" in the table represents supplying the mixed liquid of the etching liquid and the chemical compound to the upper surface of the substrate W.

TABLE 1

|  | First etching step | Second etching step |
|---|---|---|
| First processing example | Etching liquid + First chemical compound | Etching liquid + Second chemical compound |
| Second processing example | Etching liquid | Etching liquid + Chemical compound X |
| Third processing example | Etching liquid | Chemical compound X |
| Fourth processing example | Etching liquid + Chemical compound X (Cx % concentration of chemical compound) | Etching liquid + Chemical compound X (Cy % concentration of chemical compound) |
| Fifth processing example | Etching liquid + Chemical compound X (Tx ° C. overall temperature) | Etching liquid + Chemical compound X (Ty ° C. overall temperature) |

Chemical compound X is at least one of first chemical compound and second chemical compound
In third processing example, the second and subsequent first etching steps are necessary In the above description, the example (the first processing example) of supplying the upper surface of the substrate W with the first etching liquid (the etching liquid containing the first chemical compound) and then supplying the upper surface of the substrate W with the second etching liquid (the etching liquid containing the second chemical compound) has been described.

As shown in the second processing example in the table 1, the etching liquid not containing the first chemical compound and the second chemical compound may be supplied to the upper surface of the substrate W in the first etching step, and the etching liquid containing at least one of the first chemical compound and the second chemical compound may be supplied to the upper surface of the substrate W in the second etching step As shown in the third processing example in the table 1, the etching liquid not containing the chemical compound may be supplied to the upper surface of the substrate W in the first etching step, and the chemical-compound-containing liquid that contains the chemical compound may be supplied to the upper surface of the substrate W in the second etching step. In this case, when the chemical-compound-containing liquid is supplied to the entire region of the upper surface of the substrate W, etching stops or nearly stops over the entire region of the upper surface of the substrate W. When the etching liquid not containing the chemical compound is supplied to the upper surface of the substrate W after supplying the chemical-compound-containing liquid (the first etching step for the second time), the chemical compound contained in the chemical-compound-containing liquid on the substrate W dissolves in the etching liquid, and the etching liquid containing the chemical compound is supplied to the entire region of the upper surface of the substrate W. Thus, in the second and subsequent first etching steps, anisotropy of etching is reduced compared to the first etching step for the first time. Accordingly, anisotropic etching is performed in the first etching step for the first time and isotropic etching is performed in the second and subsequent first etching steps.

As shown in the fourth processing example in the table 1, the etching liquid having Cx % (Cx is a value greater than 0) concentration of at least one of the first chemical compound and the second chemical compound may be supplied to the upper surface of the substrate W in the first etching step, and the etching liquid having Cy % (Cy is a value greater than 0 and different from Cx) concentration of at least one of the first chemical compound and the second chemical compound may be supplied to the upper surface of the substrate W in the second etching step.

As shown in the fifth processing example in the table 1, the etching liquid having Tx degrees Celsius and containing at least one of the first chemical compound and the second chemical compound may be supplied to the upper surface of the substrate W in the first etching step, and the etching liquid having Ty degrees Celsius (Ty is different from Tx) and containing at least one of the first chemical compound and the second chemical compound may be supplied to the upper surface of the substrate W in the second etching step.

Figure 9A:
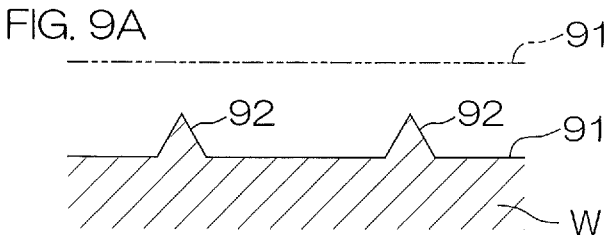
FIG. 9A is a schematic view showing a cross-section of the substrate supplied with the first etching liquid in the example of the processing of the substrate shown in FIG. 8.
Figure 9B:
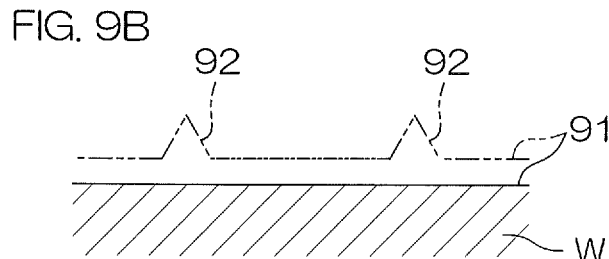
FIG. 9B is a schematic view showing a cross-section of the substrate supplied with the second etching liquid in the example of the processing of the substrate shown in FIG. 8.
Figure 10:
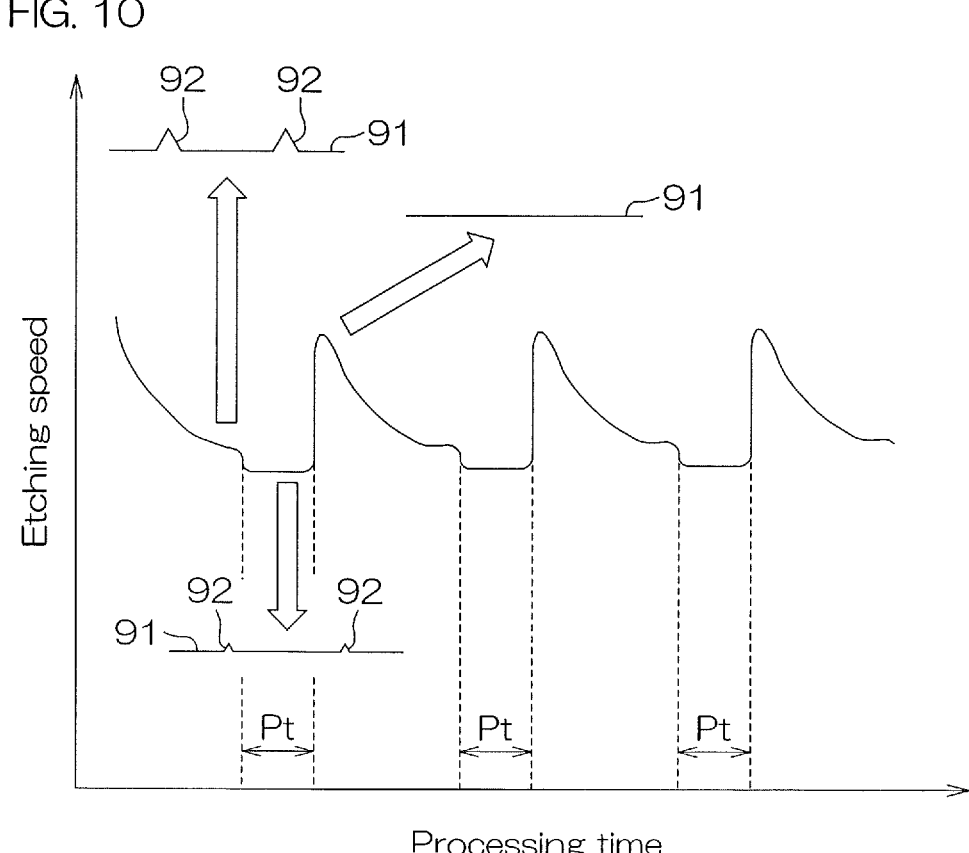
FIG. 10 is a graph showing the relationship between the processing time and the etching speed when the first etching liquid and the second etching liquid are alternately supplied a plurality of times in the example of the processing of the substrate shown in FIG. 8.

FIG. 9A is a schematic view showing a cross-section of the substrate W supplied with the first etching liquid in the example of the processing of the substrate W shown in FIG. 8. FIG. 9B is a schematic view showing a cross-section of the substrate W supplied with the second etching liquid in the example of the processing of the substrate W shown in FIG. 8. FIG. 10 is a graph showing the relationship between the processing time and the etching speed when the first etching liquid and the second etching liquid are alternately supplied a plurality of times in the example of the processing of the substrate W shown in FIG. 8. A period Pt in FIG. 10 represents a period during which the second etching liquid is discharged.

In the examples shown in FIG. 9A to FIG. 9B, the substrate W is a silicon wafer not having a pattern (so-called bare wafer (disc-shaped silicon single crystal)), the etching target 91 is the upper surface of the silicon wafer. The upper surface of the silicon wafer is the (100) plane, for example.

The alternate long and two short dashes line in FIG. 9A shows a shape of the upper surface of the silicon wafer after a native oxide film of silicon is removed by supply of DHF and before the first etching liquid is supplied. The continuous line in FIG. 9A shows a shape of the upper surface of the silicon wafer after the first etching liquid is supplied. The alternate long and two short dashes line in FIG. 9B shows a shape of the upper surface of the silicon wafer after the first etching liquid is supplied and before the second etching liquid is supplied. The continuous line in FIG. 9B shows a shape of the upper surface of the silicon wafer after the second etching liquid is supplied.

In the following description, the maximum value of the etching speeds when the first etching liquid is supplied to the (110) plane, the (100) plane and the (111) plane of silicon shall be greater than the maximum value of the etching speeds when the second etching liquid is supplied to the (110) plane, the (100) plane and the (111) plane of silicon, and the difference between the maximum value and the minimum value of the etching speeds when the first etching liquid is supplied shall be greater the difference between the maximum value and the minimum value of the etching speeds when the second etching liquid. That is, compared to the second etching liquid, the first etching liquid is more anisotropic in etching but has a high etching speed (high etching rate).

As described above, the first etching liquid is the etching liquid containing the first chemical compound. When a silicon single crystal is etched by the etching liquid contained in the first etching liquid, the etching speed differs for each crystal plane. However, the upper surface of the substrate W (the upper surface of the disc-shaped silicon single crystal) before the first etching liquid is first supplied to the substrate W is the (100) plane, and the (100) plane is exposed at any position within the upper surface of the substrate W. Thus, when the first etching liquid is supplied to the upper surface of the substrate W, the upper surface of the substrate W is uniformly etched while the upper surface of the substrate W remains flat.

However, as shown in FIG. 9A by the continuous line, as the etching of the upper surface of the substrate W progresses, the upper surface of the substrate W may become uneven. This is because cracks and defects can exist in the silicon single crystal. That is, if there are cracks and defects, the (111) planes, which has a relatively low etching speed, are exposed, and unevenness of etching occurs. Thus, a plurality of projecting portions 92 may be formed in the upper surface of the substrate W. FIG. 9A shows an example in which a plurality of pyramid-shaped projecting portions 92 are formed in the upper surface of the substrate W. The side surfaces of the pyramid-shaped projecting portion 92 are the (111) planes and have relatively low etching speeds. If such projecting portions 92 remain on the substrate W that has been processed, the substrate W may be evaluated as having poor quality such as surface roughness or etching residue.

As shown in FIG. 10, when the supply of the first etching liquid is started, the etching speed decreases over time. This is because the projecting portion 92 in which the (111) plane is exposed gradually becomes larger, and the contact area between the (100) plane and the first etching liquid decreases accordingly. After a predetermined time has elapsed since the supply of the first etching liquid is started, the second etching liquid, which is less anisotropic in etching compared to the first etching liquid, is supplied to the upper surface of the substrate W. Thus, although the etching speed is low compared to that of the first etching liquid (refer to the period Pt in FIG. 10), etching proceeds not only on the flat portion (a portion in which the (100) plane is exposed) of the upper surface of the substrate W, but also on the side surfaces (a portion in which the (111) plane is exposed) of the projecting portion 92. Thus, As shown in FIG. 9B, the projecting portion 92 gradually becomes smaller, or the projecting portion 92 disappears from the upper surface of the substrate W.

After a predetermined time has elapsed since the supply of the second etching liquid is started, the first etching liquid is supplied to the upper surface of the substrate W again. Since the projecting portion 92 is downsized or removed by the supply of the second etching liquid, when the first etching liquid is supplied to the upper surface of the substrate W, the upper surface of the substrate W is uniformly etched while the upper surface of the substrate W remains flat or substantially flat. If the projecting portion 92 is formed again or enlarged by the second supply of the first etching liquid, the projecting portion 92 is downsized or removed by the second supply of the second etching liquid. Thus, the flatness of the upper surface of the substrate W that has been processed can be increased.

In this way, since the first etching liquid with relatively high etching speed and the second etching liquid with relatively low anisotropy are alternately supplied to the substrate W, it is possible to uniformly etch the upper surface of the substrate W while shortening the processing time. That is, if only the second etching liquid is continuously supplied, the upper surface of the substrate W can be uniformly etched, but the etching takes a long time because the etching speed of the second etching liquid is relatively low. On the contrary, if the first etching liquid and the second etching liquid are alternately supplied to the substrate W, it is possible to shorten the processing time while ensuring the same level of flatness of the upper surface of the substrate W compared to the case where only the second etching liquid is continuously supplied.

Figures 11, 12:
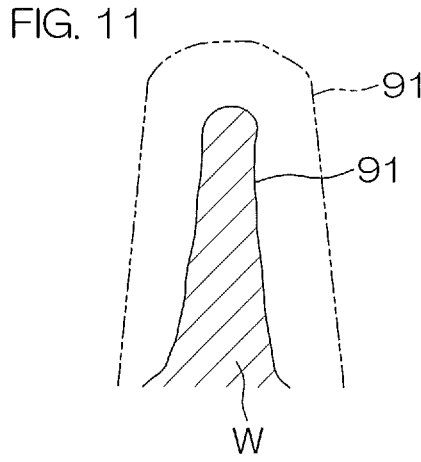
FIG. 11 is a schematic view showing a cross-section of a fin after the fin of silicon is etched using the etching liquid not containing the chemical compound.
FIG. 12 is a schematic view showing a cross-section of the fin after the first etching liquid and the second etching liquid are alternately supplied in the example of the processing of the substrate W shown in FIG. 8 and the fin of silicon is etched.

FIG. 11 is a schematic view showing a cross-section of a fin after the fin of silicon is etched using the etching liquid not containing the chemical compound. FIG. 12 is a schematic view showing a cross-section of the fin after the first etching liquid and the second etching liquid are alternately supplied in the example of the processing of the substrate W shown in FIG. 8 and the fin of silicon is etched.

The alternate long and two short dashes line in FIG. 11 shows the shape of the fin before the etching liquid not containing the chemical compound is supplied, and the continuous line in FIG. 11 shows the shape of the fin after the etching liquid not containing the chemical compound is supplied. The alternate long and two short dashes line in FIG. 12 shows the shape of the fin before the first etching liquid is supplied, and the alternate long and short dash line in FIG. 12 shows the shape of the fin after the first etching liquid is supplied and before the second etching liquid is supplied. The continuous line in FIG. 12 shows the shape of the fin after the second etching liquid is supplied.

In the examples shown in FIG. 11 and FIG. 12, the substrate W is the silicon wafer on which the pattern is formed, and the etching target 91 is a surface layer of the fin formed on the upper surface of the substrate W. The fin is made of the silicon single crystal. An upper surface of the fin is the (100) plane, and a right side surface and a left side surface of the fin are the (110) planes. Although not shown, in addition to the fin which is an example of the etching target, the non-etching target such as silicon oxide or silicon nitride may be exposed in the front surface of the substrate W. In this case, selective etching to etch the etching target 91 while inhibiting etching of the non-etching target is performed.

Since alkaline etching liquid is anisotropic etching liquid, when the etching liquid not containing the chemical compound is supplied to the upper surface of the substrate W, as shown in FIG. 11, the surface layer of the fin made of silicon single crystal is ununiformly etched. FIG. 11 shows an example in which the etching amount decreases as the lower end of the fin is approached and the fin becomes thicker as the lower end of the fin is approached. This is because the (100) and (110) planes with relatively high etching speeds are disposed on the upper and side surfaces of the fin, while the (111) plane with relatively low etching speed faces obliquely upward. Thus, etching in the downward and width directions is relatively fast, and etching in the obliquely downward direction is relatively slow.

As shown in FIG. 12 by the alternate long and short dash line, when the first etching liquid with relatively high etching speed is supplied to the upper surface of the substrate W, the surface layer of the fin is immediately etched. However, since the anisotropy is high compared to the second etching liquid, as in the case where the etching liquid not containing the chemical compound is supplied to the upper surface of the substrate W, the etching amount of the fin decreases as the lower end of the fin is approached.

After a predetermined time has elapsed since the supply of the first etching liquid is started, the second etching liquid with low anisotropy compared to the first etching liquid is supplied to the upper surface of the substrate W. Thus, the difference between the maximum value and the minimum value of the etching speeds decreases and the relative etching speed of the (111) plane increases. As a result, the surface layer of the fin is uniformly etched with respect to the shape of the fin before the first etching liquid is supplied, that is, the shape shown by the alternate long and two short dashes line in FIG. 12. Thus, it is possible to precisely approximate the fin to the intended shape while shortening the processing time.

As described above, in the present preferred embodiment, the alkaline first etching liquid (the alkaline etching liquid containing the first chemical compound) is supplied to the substrate W in which the etching target 91 representing at least one of silicon single crystal and polysilicon is exposed. Thus, the etching target 91 is etched. Before or after the first etching liquid is supplied to the substrate W, the alkaline second etching liquid (the alkaline etching liquid containing the second chemical compound) is supplied to the substrate W. Thus, the etching target 91 is further etched.

The second etching liquid is liquid containing the chemical compound that inhibits contact of the hydroxide ion and the etching target 91. This chemical compound changes anisotropy of etching and the etching speeds. Specifically, the second etching liquid has the smaller difference between the maximum value and the minimum value of etching speeds for the (110) plane, the (100) plane, and the (111) plane of silicon than that of the first etching liquid. That is, the second etching liquid has a lower anisotropy of etching than the first etching liquid. Further, the second etching liquid has the maximum value of the etching speeds for these crystal planes smaller than that of the first etching liquid.

When the first etching liquid is supplied to the substrate W, although the etching uniformity is inferior to that of the second etching liquid, the etching target 91 is etched at a relatively high speed. When the second etching liquid is supplied to the substrate W, although the etching is slower compared to the first etching liquid, the etching target 91 is uniformly etched. Thus, it is possible to uniformly etch the etching target 91 while shortening the processing time compared to the case where the second etching liquid is continuously supplied by supplying the substrate W with the first etching liquid and the second etching liquid that differ from each other in anisotropy of etching and the etching speed.

In the present preferred embodiment, after the first etching liquid has been supplied to the substrate W, the second etching liquid is supplied to the substrate W rather than supplying liquid other than the second etching liquid to the substrate W. Thus, the first etching liquid on the substrate W is replaced with the second etching liquid. When the etching target 91 is oxidized, the surface layer of the etching target 91 changes to silicon oxide. Silicon oxide is not etched or hardly etched by alkaline etching liquid.

If the second etching liquid is supplied to the substrate W immediately after the first etching liquid is supplied to the substrate W, it is possible to shorten the time from the supply of the first etching liquid to the supply of the second etching liquid and to inhibit or prevent oxidation of the etching target 91. Thus, it is possible to bring the actual shape of the etching target 91 that has been etched closer to the intended shape while shortening the processing time compared to the case where the second etching liquid is continuously supplied.

In the present preferred embodiment, the chemical compound is contained not only in the second etching liquid but also in the first etching liquid. Thus, the first etching liquid is also lowered in anisotropy of etching. The first etching liquid and the second etching liquid differ from each other in at least one of composition, concentration, and temperature. If at least one of these is different, anisotropy of etching and the etching speed will change. Thus, it is possible to uniformly etch the etching target 91 while shortening the processing time compared to the case where the second etching liquid is continuously supplied.

In the present preferred embodiment, the first etching liquid and the second etching liquid are alternately supplied to the substrate W a plurality of times. When the first etching liquid having high anisotropy is continuously supplied to the substrate W, an area in which the (111) plane having low etching speed is exposed increases. In this case, since a contact area between the crystal planes other than the (111) plane and the first etching liquid is reduced, the etching speed is lowered. If the second etching liquid having low anisotropy is supplied, the (111) plane is etched and an area in which this crystal plane is exposed decreases. After that, if the first etching liquid is supplied to the substrate W, it is possible to etch the substrate W at a high etching speed again.

Next, a second preferred embodiment will be described.

The second preferred embodiment mainly differs from the first preferred embodiment in that a substrate processing apparatus 101 is a batch type apparatus that processes a plurality of substrates W in a batch.

Figure 13:
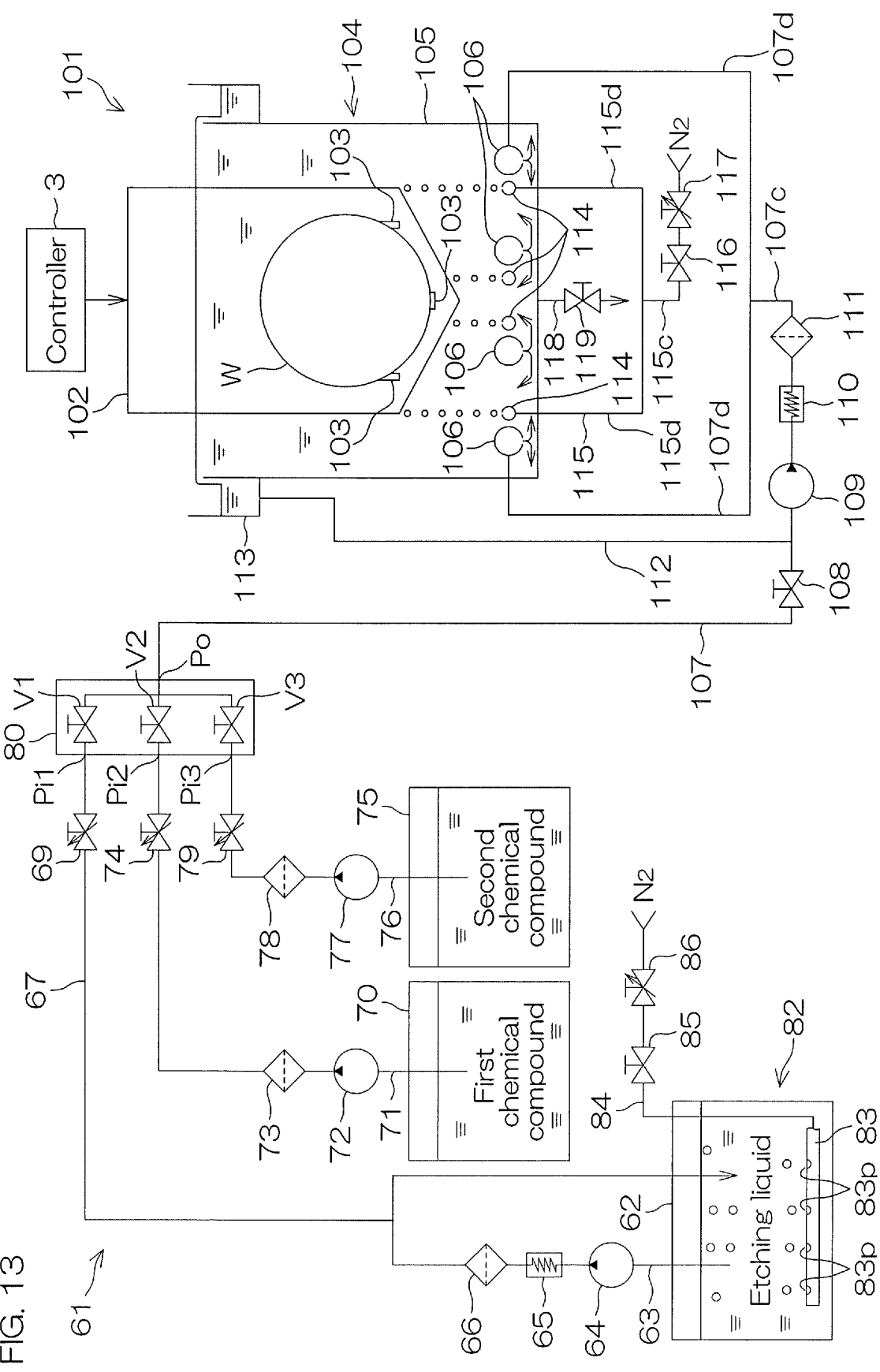
FIG. 13 is a schematic view showing an etching unit included in a substrate processing apparatus according to a second preferred embodiment of the present invention.

FIG. 13 is a schematic view showing an etching unit 104a included in a substrate processing apparatus 101 according to the second preferred embodiment of the present invention. In FIG. 13, components equivalent to the components described above and shown in FIG. 1 to FIG. 12 are designated by the same reference characters as in FIG. 1, etc., and description thereof is omitted.

The substrate processing apparatus 101 includes a plurality of processing units that process a plurality of substrates W in a batch, a transfer unit that performs a carry-in operation to carry a plurality of substrates W into the processing unit and a carry-out operation to carry out a plurality of substrates W from the processing unit, and the controller 3 that controls the substrate processing apparatus 101. The plurality of processing units include an etching unit 104 that supplies the etching liquid to a plurality of substrates W at the same time. Although not shown, the plurality of processing units further include a rinse processing unit that supplies rinse liquid to the plurality of substrates W at the same time to which the etching liquid is supplied, and a drying processing unit that dries the plurality of substrates W at the same time to which the rinse liquid is supplied.

The etching unit 104 includes an immersion bath 105 that stores the etching liquid and into which a plurality of substrates W are simultaneously carried. The transfer unit includes a holder that holds a plurality of substrates W with each substrate W in a vertical posture and a lifter 102 that raises and lowers the holder 103 between a lower position where a plurality of substrates W held by the holder 103 are immersed in the etching liquid in the immersion bath 105 and an upper position where a plurality of substrates W held by the holder 103 are positioned above the etching liquid in the immersion bath 105.

The etching unit 104 further includes a plurality of etching liquid nozzles 106 including etching liquid discharge ports to discharge the etching liquid and a plurality of gas nozzles 114 including gas discharge ports to discharge inert gas. Each of the etching liquid nozzle 106 and the gas nozzle 114 has a tubular shape horizontally extending in the immersion bath 105. The plurality of etching liquid nozzles 106 and the plurality of gas nozzles 114 are disposed parallel to each other in a horizontal posture. One or more gas nozzles 114 are disposed between two adjacent etching liquid nozzles 106. When the holder 103 is disposed at the lower position (a position shown in FIG. 13), the plurality of etching liquid nozzles 106 and the plurality of gas nozzles 114 are disposed below a plurality of substrates W held by the holder 103.

The etching liquid piping 107 is connected to the plurality of etching liquid nozzles 106. The etching liquid piping 107 includes common piping 107c that guide the etching liquid to be supplied to the plurality of etching liquid nozzles 106, and a plurality of branch pipes 107d that supply the plurality of etching liquid nozzles 106 with the etching liquid supplied from the common piping 107c. The common piping 107c is connected to the mixing valve 80. The etching liquid valve 108 is interposed in the common piping 107c. The plurality of branch pipes 107d are branched from the common piping 107c. The plurality of branch pipes 107d are connected to the plurality of etching liquid nozzles 106, respectively. In FIG. 13, it is depicted as if the branch pipes 107d are connected to only the two etching liquid nozzles 106 on both sides, but the branch pipes 107d are also connected to the other etching liquid nozzles 106.

gas piping 115 is connected to the plurality of gas nozzles 114. The gas piping 115 includes common piping 115c that guide gas to be supplied the plurality of gas nozzles 114, and a plurality of branch pipes 115d that supply the plurality of gas nozzles 114 with gas supplied from the common piping 115c. The common piping 115c is connected to an inert gas supply source. A gas valve 116 and a flow rate adjusting valve 117 are interposed in the common piping 115c. The plurality of branch pipes 115d are branched from the common piping 115c. The plurality of branch pipes 115d are connected to the plurality of gas nozzles 114, respectively. In FIG. 13, it is depicted as if the branch pipes 115d are connected to only the two gas nozzles 114 on both sides, but the branch pipes 115d are also connected to the other gas nozzles 114.

The etching unit 104 includes an overflow bath 113 that receives the etching liquid overflowing from the immersion bath 105. The upstream end of return piping 112 is connected to the overflow bath 113, and the downstream end of the return piping 112 is connected to the common piping 107c of the etching liquid piping 107 at a position downstream of the etching liquid valve 108. The etching liquid overflowing from the immersion bath 105 to the overflow bath 113 is sent to the plurality of etching liquid nozzles 106 again by a pump 109 and filtered by a filter 111 before reaching the plurality of etching liquid nozzles 106. The etching unit 104 may include a temperature controller 110 that changes the temperature of the etching liquid in the immersion bath 105 by heating or cooling the etching liquid.

When the plurality of etching liquid nozzles 106 discharge the etching liquid, the etching liquid is supplied to the inside of the immersion bath 105, an upward flow of the etching liquid is formed within the immersion bath 103. The etching liquid overflowing from an opening provided in an upper end of the immersion bath 105 is received by the overflow bath 113 and returned to the plurality of etching liquid nozzles 106 via the return piping 112. Thus, the etching liquid circulates. On the other side, a drainage valve 119 interposed in the drainage piping 118 is opened, liquid in the immersion bath 105 such as the etching liquid is discharged to the drainage piping 118.

When the first etching liquid (the etching liquid containing the first chemical compound) and the second etching liquid (the etching liquid containing the second chemical compound) are supplied to a plurality of substrates W held by the holder 103, the first etching liquid is supplied to the immersion bath 105 via the plurality of etching liquid nozzles 106 in a state where the drainage valve 119 is closed. When a predetermined time has elapsed since the supply of the first etching liquid is started, the drainage valve 119 is opened and the first etching liquid in the immersion bath 105 is discharged. After that, the second etching liquid is supplied to the immersion bath 105 via the plurality of etching liquid nozzles 106 in a state where the drainage valve 119 is closed.

Instead of sequentially supplying the first etching liquid and the second etching liquid to one immersion bath 105, the immersion bath 105 storing the first etching liquid and the immersion bath 105 storing the second etching liquid may be provided and a plurality of substrates W constituting one batch may be sequentially carried into the two immersion baths 105. By doing so, it is possible to omit the replacement of the etching liquid to change the first etching liquid in the immersion bath 105 to the second etching liquid.

The first etching liquid and the second etching liquid may be mixed inside the immersion bath 105. For example, after a predetermined time has elapsed since the supply of the first etching liquid is started, the supply of the first etching liquid may be stopped and then the supply of the second etching liquid may be started. In this case, the first etching liquid and the second etching liquid are mixed at the immersion bath 105, and the dissolved oxygen concentration of the etching liquid to be supplied to the substrate W is changed.

Instead of sequentially supplying the first etching liquid and the second etching liquid to the substrate W, only the etching liquid may be supplied to the immersion tank 105 first, and then at least one of the first chemical-compound-containing liquid and the second chemical-compound-containing liquid may be mixed with the etching liquid in the immersion bath 105. In this case, the etching liquid not containing the chemical compound is supplied to a plurality of substrates W held by the holder 103, and then the etching liquid containing the chemical compound is supplied to the plurality of substrates W held by the holder 103.

Other Preferred Embodiments

The present invention is not restricted to the contents of the preferred embodiments described above and various modifications are possible.

For example, in the first preferred embodiment, the etching liquid may be supplied not to the upper surface of the substrate W but to the lower surface of the substrate W. Alternatively, the etching liquid may be supplied to both the upper surface and the lower surface of the substrate W. In these cases, the lower surface nozzle 15 may discharge the etching liquid.

In the first preferred embodiment, the first etching liquid and the second etching liquid may be discharged from separate nozzles, the etching liquid, the first chemical-compound-containing liquid and the second chemical-compound-containing liquid may be discharged from separate nozzles. In the latter case, at least two of the etching liquid, the first chemical-compound-containing liquid and the second chemical-compound-containing liquid are mixed at the upper surface of the substrate W or a space between the upper surface of the substrate W and a nozzle.

In the first preferred embodiment, a first etching liquid tank that stores the first etching liquid and a second etching liquid tank that stores the second etching liquid may be provided. In this case, the first etching liquid and the second etching liquid may be discharged toward the substrate W from the same nozzle, or may be discharged toward the substrate W from separate nozzles.

In the first preferred embodiment, instead of replacing the first etching liquid on the substrate W with the second etching liquid, the first etching liquid on the substrate W may be replaced with liquid (intermediate liquid) other than the second etching liquid, and then the intermediate liquid on the substrate W may be replaced with the second etching liquid. Alternatively, two or more liquids may be sequentially supplied to the substrate W between the supply of the first etching liquid and the supply of the second etching liquid. For example, the first etching liquid on the substrate W may be replaced with first intermediate liquid, the first intermediate liquid on the substrate W may be replaced with second intermediate liquid, and the second intermediate liquid on the substrate W may be replaced with the second etching liquid.

The tubular portion 37 may be omitted from the shielding member 33. The upper support portions 43 and the lower support portions 44 may be omitted from the shielding member 33 and spin chuck 10.

The shielding member 33 may be omitted from the processing unit 2. In this case, the processing unit 2 may include a nozzle that discharges the processing liquid such as the chemical liquid toward the substrate W. The nozzle may be a scan nozzle that is horizontally movable in the chamber 4, or may be a fixed nozzle that is fixed with respect to the partition wall 6 of the chamber 4. The nozzle may include a plurality of liquid discharge ports that supply the processing liquid to the upper surface or the lower surface of the substrate W by simultaneously discharging the processing liquid toward a plurality of positions away in the radial direction of the substrate W. In this case, at least one of the flow rate, the temperature and the concentration of the processing liquid to be discharged may be changed for each of the liquid discharge ports.

The substrate processing apparatus 1 is not restricted to an apparatus to process a disc-shaped substrate W, and may be an apparatus to process a polygonal substrate W.

Two or more arrangements among all the arrangements described above may be combined. Two or more steps among all the steps described above may be combined.

The spin chuck 10 and the holder 103 are examples of the substrate holding unit. The processing liquid supplying unit 61 is an example of the first etching unit. The processing liquid supplying unit 61 is also an example of the second etching unit.

The preferred embodiments of the present invention are described in detail above, however, these are just detailed examples used for clarifying the technical contents of the present invention, and the present invention should not be limitedly interpreted to these detailed examples, and the spirit and scope of the present invention should be limited only by the claims appended hereto.

REFERENCE SIGNS LIST

1: substrate processing apparatus
10: spin chuck
45: center nozzle
47: etching liquid discharge port
61: processing liquid supplying unit
62: etching liquid tank
70: first chemical compound tank
75: second chemical compound tank
91: etching target
92: projecting portion
101: substrate processing apparatus
103: holder

34

104: etching unit
W: substrate
What is claimed is:

1. A substrate processing method to process a substrate including an etching target that represents at least one of silicon single crystal and polysilicon, the substrate processing method comprising:
etching the etching target by supplying the substrate with alkaline first etching liquid; and
etching the etching target by supplying the substrate with alkaline second etching liquid before or after the first etching liquid is supplied to the substrate, the second etching liquid containing a chemical compound that inhibits contact of a hydroxide ion and the etching target, the second etching liquid having a smaller difference between a maximum value and a minimum value of etching speeds for a (110) plane, a (100) plane, and a (111) plane of silicon than that of the first etching liquid, the second etching liquid having the maximum value of the etching speeds smaller than that of the first etching liquid wherein
the chemical compound is at least one of glycol and ether.

2. The substrate processing method according to claim 1, wherein etching the etching target by supplying the substrate with the second etching liquid includes replacing the first etching liquid that is in contact with the substrate with the second etching liquid by supplying the second etching liquid to the substrate.

3. The substrate processing method according to claim 1, wherein etching the etching target by supplying the substrate with the second etching liquid includes at least mixing the chemical compound with the first etching liquid that is in contact with the substrate or mixing the first etching liquid with a chemical-compound-containing liquid in a state in which the chemical-compound-containing liquid that contains the chemical compound is in contact with the substrate.

4. A substrate processing method to process a substrate including an etching target that represents at least one of silicon single crystal and polysilicon, the substrate processing method comprising:
etching the etching target by supplying the substrate with alkaline first etching liquid; and
etching the etching target by supplying the substrate with alkaline second etching liquid before or after the first etching liquid is supplied to the substrate, the second etching liquid containing a chemical compound that inhibits contact of a hydroxide ion and the etching target, the second etching liquid having a smaller difference between a maximum value and a minimum value of etching speeds for a (110) plane, a (100) plane, and a (111) plane of silicon than that of the first etching liquid, the second etching liquid having the maximum value of the etching speeds smaller than that of the first etching liquid, wherein
the first etching liquid is alkaline etching liquid containing the chemical compound and
the first etching liquid and the second etching liquid differ from each other in at least one of composition, concentration, and temperature.

5. A substrate processing method to process a substrate including an etching target that represents at least one of silicon single crystal and polysilicon, the substrate processing method comprising:
etching the etching target by supplying the substrate with alkaline first etching liquid; and
etching the etching target by supplying the substrate with alkaline second etching liquid before or after the first etching liquid is supplied to the substrate, the second etching liquid containing a chemical compound that inhibits contact of a hydroxide ion and the etching target, the second etching liquid having a smaller difference between a maximum value and a minimum value of etching speeds for a (110) plane, a (100) plane, and a (111) plane of silicon than that of the first etching liquid, the second etching liquid having the maximum value of the etching speeds smaller than that of the first etching liquid; wherein one cycle including the etching with the first etching liquid and the etching with the second etching liquid is performed a plurality of times.

\*    \*    \*    \*    \*